US012578645B2

(12) United States Patent
Chang et al.

(10) Patent No.: US 12,578,645 B2
(45) Date of Patent: Mar. 17, 2026

(54) METHOD OF MANUFACTURING A SEMICONDUCTOR DEVICE

(71) Applicant: TAIWAN SEMICONDUCTOR MANUFACTURING COMPANY, LTD., Hsinchu (TW)

(72) Inventors: Ching-Yu Chang, Yuansun Village (TW); An-Ren Zi, Hsinchu City (TW); Chin-Hsiang Lin, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 820 days.

(21) Appl. No.: 17/837,827

(22) Filed: Jun. 10, 2022

(65) Prior Publication Data

US 2023/0333477 A1 Oct. 19, 2023

Related U.S. Application Data

(60) Provisional application No. 63/331,389, filed on Apr. 15, 2022.

(51) Int. Cl.
*G03F 7/16* (2006.01)
*G03F 7/00* (2006.01)
(Continued)

(52) U.S. Cl.
CPC ................ *G03F 7/168* (2013.01); *G03F 7/11* (2013.01); *G03F 7/325* (2013.01); *G03F 7/38* (2013.01);
(Continued)

(58) Field of Classification Search
CPC .... H01L 21/0273; H01L 21/0228; G03F 7/11; G03F 7/09; G03F 7/0035; G03F 7/168;
(Continued)

(56) References Cited

U.S. PATENT DOCUMENTS 6,218,082 B1 4/2001 Yang
8,796,666 B1 8/2014 Huang et al.
(Continued)

FOREIGN PATENT DOCUMENTS

DE 10120659 A1 * 11/2002 .......... G03F 7/0045
JP H08076382 A 3/1996
(Continued)

OTHER PUBLICATIONS

DE10120659—English Machine Translation (Year: 2025).*

*Primary Examiner* — Jose R Diaz
(74) *Attorney, Agent, or Firm* — STUDEBAKER BRACKETT PLLC

(57) ABSTRACT

A method of manufacturing a semiconductor device includes forming a photoresist layer over a substrate and applying a base composition to the photoresist layer, the base composition includes non-organic base, organic base, thermal base generator, or photobase generator. The photoresist layer is selectively exposed to actinic radiation to form latent pattern. The latent pattern is developed by applying developer composition to selectively exposed photoresist layer to form pattern in photoresist layer. The base composition is applied to photoresist layer during one or more operations selected from group consisting of applying base composition to substrate as underlayer before photoresist layer is formed and the composition is subsequently absorbed by photoresist layer, a pre-exposure baking operation, after photoresist layer is selectively exposed and before developing latent pattern, and after developing latent pattern.

20 Claims, 21 Drawing Sheets

(51) Int. Cl.

| | |
|---|---|
| ***G03F 7/11*** | (2006.01) |
| ***G03F 7/32*** | (2006.01) |
| ***G03F 7/38*** | (2006.01) |
| ***H01L 21/02*** | (2006.01) |
| ***H01L 21/027*** | (2006.01) |

(52) U.S. Cl.
CPC .... *G03F 7/70025* (2013.01); *H01L 21/02118* (2013.01); *H01L 21/02205* (2013.01); *H01L 21/02274* (2013.01); *H01L 21/0228* (2013.01); *H01L 21/0275* (2013.01)

(58) Field of Classification Search
CPC .......... G03F 7/167; G03F 7/004; G03F 7/094; G03F 7/70466; G03F 7/0382; G03F 7/32; G03F 7/0042; G03F 7/027; G03F 7/0397; G03F 7/0044; G03F 7/0045; G03F 1/76; G03F 1/56; G03F 7/38
See application file for complete search history.

(56) References Cited

U.S. PATENT DOCUMENTS

| | | | | |
|---|---|---|---|---|
| 9,093,530 | B2 | 7/2015 | Huang et al. | |
| 9,213,234 | B2 | 12/2015 | Chang | |
| 9,223,220 | B2 | 12/2015 | Chang | |
| 9,256,133 | B2 | 2/2016 | Chang | |
| 9,536,759 | B2 | 1/2017 | Yang et al. | |
| 9,548,303 | B2 | 1/2017 | Lee et al. | |
| 9,857,684 | B2 | 1/2018 | Lin et al. | |
| 9,859,206 | B2 | 1/2018 | Yu et al. | |
| 9,875,892 | B2 | 1/2018 | Chang et al. | |
| 11,029,602 | B2 * | 6/2021 | Zi | G03F 7/162 |
| 11,054,742 | B2 | 7/2021 | Zi et al. | |
| 12,222,650 | B2 * | 2/2025 | Zi | G03F 7/039 |
| 2004/0142279 | A1 | 7/2004 | Bok et al. | |
| 2006/0111550 | A1 | 5/2006 | Hata et al. | |
| 2007/0105043 | A1 | 5/2007 | Elian et al. | |
| 2014/0363955 | A1 | 12/2014 | Hatakeyama et al. | |
| 2019/0146337 | A1 | 5/2019 | Zi et al. | |
| 2019/0146342 | A1 * | 5/2019 | Zi | G03F 7/2002 430/270.1 |
| 2021/0134589 | A1 | 5/2021 | Weng et al. | |
| 2021/0200092 | A1 | 7/2021 | Su et al. | |
| 2021/0305040 | A1 | 9/2021 | Kuo et al. | |
| 2022/0002882 | A1 * | 1/2022 | Kalutarage | G03F 7/265 |
| 2023/0168582 | A1 | 6/2023 | Shigaki et al. | |

FOREIGN PATENT DOCUMENTS

| | | | |
|---|---|---|---|
| KR | 10-1999-0065500 | A | 8/1999 |
| KR | 10-2003-0023999 | A | 3/2003 |
| KR | 10-2021-0086994 | A | 7/2021 |
| TW | 202001421 | A | 1/2020 |
| TW | 202204883 | A | 2/2022 |

* cited by examiner $(CH_3CH_2)_2NH$ $(CH_3CH_2)_3N$

METHOD OF MANUFACTURING A SEMICONDUCTOR DEVICE

CROSS REFERENCE TO RELATED APPLICATIONS

This application claims priority to U.S. Provisional Application No. 63/331,389 filed Apr. 15, 2022, the entire disclosure of which is incorporated herein by reference.

BACKGROUND

As consumer devices have gotten smaller and smaller in response to consumer demand, the individual components of these devices have necessarily decreased in size as well. Semiconductor devices, which make up a major component of devices such as mobile phones, computer tablets, and the like, have been pressured to become smaller and smaller, with a corresponding pressure on the individual devices (e.g., transistors, resistors, capacitors, etc.) within the semiconductor devices to also be reduced in size.

One enabling technology that is used in the manufacturing processes of semiconductor devices is the use of photolithographic materials. Such materials are applied to a surface of a layer to be patterned and then exposed to an energy that has itself been patterned. Such an exposure modifies the chemical and physical properties of the exposed regions of the photosensitive material. This modification, along with the lack of modification in regions of the photosensitive material that were not exposed, can be exploited to remove one region without removing the other, or vice-verse.

However, as the size of individual devices has decreased, process windows for photolithographic processing has become tighter and tighter. As such, advances in the field of photolithographic processing are necessary to maintain the ability to scale down the devices, and further improvements are needed in order to meet the desired design criteria such that the march towards smaller and smaller components may be maintained.

As the semiconductor industry has progressed into nanometer technology process nodes in pursuit of higher device density, higher performance, and lower costs, there have been challenges in reducing semiconductor feature size.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
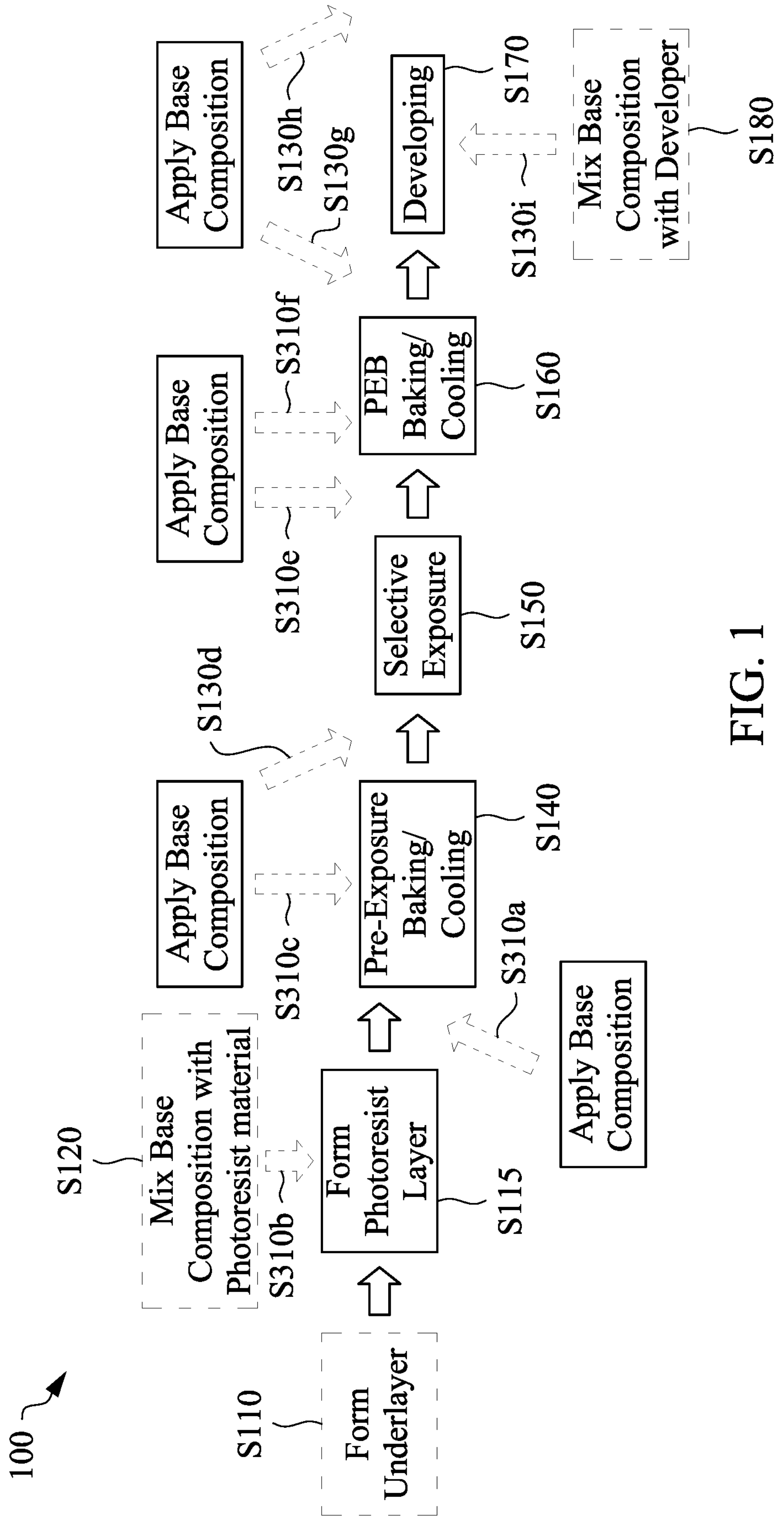
FIG. 1 illustrates process flows of manufacturing a semiconductor device according to embodiments of the disclosure.

It is to be understood that the following disclosure provides many different embodiments, or examples, for implementing different features of the disclosure. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. In addition, the term "made of" may mean either "comprising" or "consisting of." In the present disclosure, a phrase "one of A, B and C" means "A, B and/or C" (A, B, C, A and B, A and C, B and C, or A, B and C), and does not mean one element from A, one element from B and one element from C, unless otherwise described. In the present disclosure, a source and a drain are interchangeably used and may be referred to as a source/drain. Source/drain region(s) may refer to a source or a drain, individually or collectively dependent upon the context.

Improving the line width roughness (LWR) and reducing the exposure dose (EOP) are desirable in the field of photolithographic processing to continue scaling down the devices and efficiently increase semiconductor device yield. Deep ultraviolet (DUV), electron beam (e-beam) and extreme ultraviolet (EUV) lithography have been developed to decrease the critical dimension and increase device yield. EUV lithography has been developed for use in nanometer technology process nodes, such as below 40 nm process nodes. Organic polymer based photoresists are used in photolithography in some embodiments. However, C, N, and O atoms in the polymers of organic photoresists are weak in EUV photon absorption. It has been found that certain metals have higher EUV photon absorption. To use the higher EUV photon absorption of metals, metallic resist have been developed. The lithographic performance is further improved by treating the photoresist layer with a base composition having a pH>7. The base composition may be applied to the photoresist layer at various times during the photolithographic patterning process.

Figure 2:
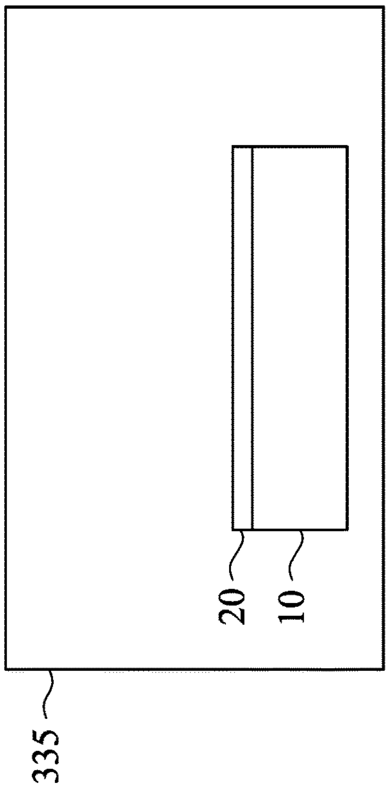
FIG. 2 shows a process stage of a sequential operation according to embodiments of the disclosure.

FIG. 1 illustrates a process flow 100 and FIGS. 2-10 illustrate various stages of manufacturing a semiconductor device according to embodiments of the disclosure. In some embodiments, a base composition underlayer 20 is formed over the substrate 10 as shown in FIG. 2, in a base composition underlayer forming operation S110 as shown in FIG. 1. Then, in operation S115 of FIG. 1, a photoresist layer 15 is formed over the base composition underlayer 20 as shown in FIG. 3A. In some embodiments, a baking operation is performed on the underlayer 20 to drive off solvents in the base composition before forming a photoresist layer over the underlayer 20. In some embodiments, the photoresist layer 15 is formed over the substrate 10 in operation S115, and then the base composition 325 is applied to the photoresist layer 15 in a base composition applying operation S130*a*, as shown in FIG. 3B. In other embodiments, the base composition is mixed with photoresist material in operation S120 to form a base composition/photoresist material mixture, which is deposited over the substrate 10 in operation S130*b* to form a photoresist layer 15 including the base composition. After forming the photoresist layer 15 over the base composition underlayer 20, the base composition is absorbed by the photoresist layer 15, as shown in FIG. 3C. In some embodiments, the base composition underlayer 20 and the photoresist layer 15 are heated to facilitate the absorption of the base composition by the photoresist layer. In some embodiments, the base composition underlayer 20 and the photoresist layer 15 are heated to a temperature ranging from about 25° C. to about 300° C. to enhance the diffusion of the base composition into the photoresist layer 15. In some embodiments, the base composition 325 is applied in a chamber 335, such as a vacuum chamber as shown in FIG. 3B. In some embodiments, the vacuum chamber 335 is used in a chemical vapor deposition (CVD) or atomic layer deposition (ALD) operation. In some embodiments, the chamber 335 is the same chamber in which the photoresist layer 15 is formed over the substrate 10. In other embodiments, the chamber 335 in which the base composition is applied is a different chamber in which the photoresist layer is formed.

Figure 4:
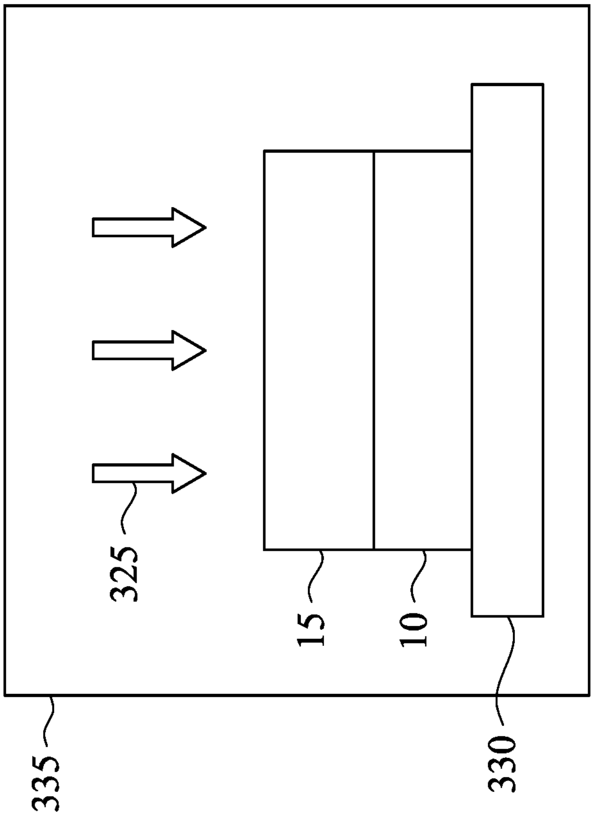
FIG. 4 shows a process stage of a sequential operation according to an embodiment of the disclosure.

In some embodiments, a pre-exposure baking operation S140 is performed to drive off solvents in the photoresist layer 15 or to cure the photoresist layer 15. In some embodiments, the baking operation is performed in a chamber 335, such as a vacuum chamber. In some embodiments, the photoresist layer 15 is heated at a temperature ranging from about 40° C. to about 300° C. for about 10 seconds to about 10 minutes. After the pre-exposure baking operation S140, the photoresist layer 15 coated substrate 10 is cooled in a cooling operation. In some embodiments, the heating and cooling is performed using a heater/chiller 330, as shown in FIG. 4. In some embodiments, the heater/chiller 330 is a hot plate that includes internal coolant flow channels. The heating or cooling is controlled by a controller 260 (see FIGS. 16A, 16B) in some embodiments.

As shown in FIG. 4, in some embodiments, the base composition 325 is applied to the photoresist layer during the pre-exposure baking or cooling S140 in operation S130*c*. In some embodiments, the photoresist layer is heated or cooled at a temperature ranging from about −30° C. to about 300° C. during the pre-exposure baking or cooling operation S140. In some embodiments, the temperature is controlled using the heater/chiller 330 and a controller 260 (see FIGS. 16A, 16B). In some embodiments, the base composition application S130*c* is performed at a heating temperature ranging from about 50° C. to about 250° C., and in other embodiments, the heating temperature ranges from about 70° C. to about 200° C. In some embodiments, the base composition application S130*c* is performed at a cooling temperature ranging from about 0° C. to about 25° C. In some embodiments, the duration of the base composition application ranges from about 1 s to about 300 s. In other embodiments, the duration of the base composition application ranges from about 10 s to about 150 s. At temperatures and time durations below the disclosed ranges, there may be insufficient base composition treatment of the photoresist layer. At temperatures and time durations greater than the disclosed ranges, there may be damage to the photoresist layer 15 or other components of the semiconductor device.

The base composition 325 is applied to the photoresist layer 15 in a base composition application operation S130*d* after the pre-exposure baking/cooling operations S140 and before a selective exposure of the photoresist layer 15 to actinic radiation S150 in some embodiments.

After the pre-exposure baking/cooling operations S140 of the photoresist layer 15, the photoresist layer 15 is selectively exposed to actinic radiation 45/97 (see FIGS. 5A and 5B) in operation S150. In some embodiments, the photoresist layer 15 is selectively exposed to ultraviolet radiation. In some embodiments, the radiation is electromagnetic radiation, such as g-line (wavelength of about 436 nm), i-line (wavelength of about 365 nm), ultraviolet radiation, deep ultraviolet radiation, extreme ultraviolet, electron beams, or the like. In some embodiments, the radiation source is selected from the group consisting of a mercury vapor lamp, xenon lamp, carbon arc lamp, a KrF excimer laser light (wavelength of 248 nm), an ArF excimer laser light (wavelength of 193 nm), an $F_2$ excimer laser light (wavelength of 157 nm), or a $CO_2$ laser-excited Sn plasma (extreme ultraviolet, wavelength of 13.5 nm).

Figure 5B:
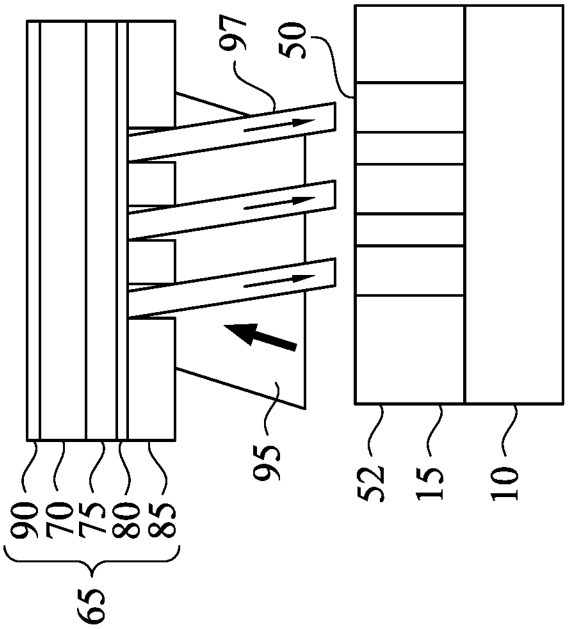
FIGS. 5A and 5B show process stages of a sequential operation according to embodiments of the disclosure.
Figure 5A:
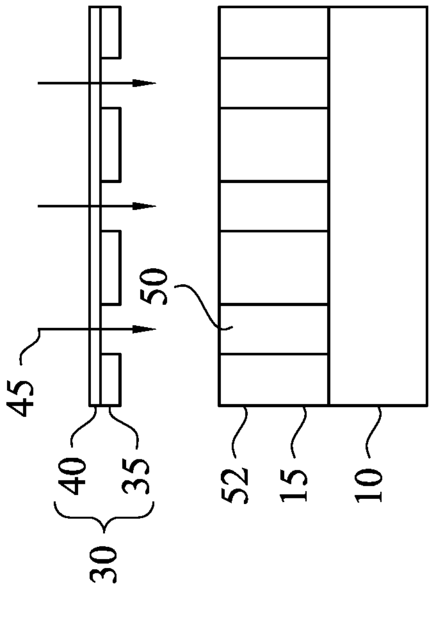

As shown in FIG. 5A, the exposure radiation 45 passes through a photomask 30 before irradiating the photoresist layer 15 in some embodiments. In some embodiments, the photomask has a pattern to be replicated in the doped photoresist layer 15. The pattern is formed by an opaque pattern 35 on the photomask substrate 40, in some embodiments. The opaque pattern 35 may be formed by a material opaque to ultraviolet radiation, such as chromium, while the photomask substrate 40 is formed of a material that is transparent to ultraviolet radiation, such as fused quartz.

In some embodiments, the selective exposure of the doped photoresist layer 15 to form exposed regions 50 and unexposed regions 52 is performed using extreme ultraviolet lithography. In an extreme ultraviolet lithography operation, a reflective photomask 65 is used to form the patterned exposure light in some embodiments, as shown in FIG. 5B. The reflective photomask 65 includes a low thermal expansion glass substrate 70, on which a reflective multilayer 75 of Si and Mo is formed. A capping layer 80 and absorber layer 85 are formed on the reflective multilayer 75. A rear conductive layer 90 is formed on the back side of the low thermal expansion glass substrate 70. In extreme ultraviolet lithography, extreme ultraviolet radiation 95 is directed towards the reflective photomask 65 at an incident angle of about 6°. A portion 97 of the extreme ultraviolet radiation is reflected by the Si/Mo multilayer 75 towards the photoresist coated substrate 10, while the portion of the extreme ultraviolet radiation incident upon the absorber layer 85 is absorbed by the photomask. In some embodiments, additional optics, including mirrors, are between the reflective photomask 65 and the photoresist coated substrate.

The region of the photoresist layer exposed to radiation 50 undergoes a chemical reaction thereby changing its solubility in a subsequently applied developer relative to the region of the photoresist layer not exposed to radiation 52. In some embodiments, the portion of the doped photoresist layer exposed to radiation 50 undergoes a crosslinking reaction.

Figure 6:
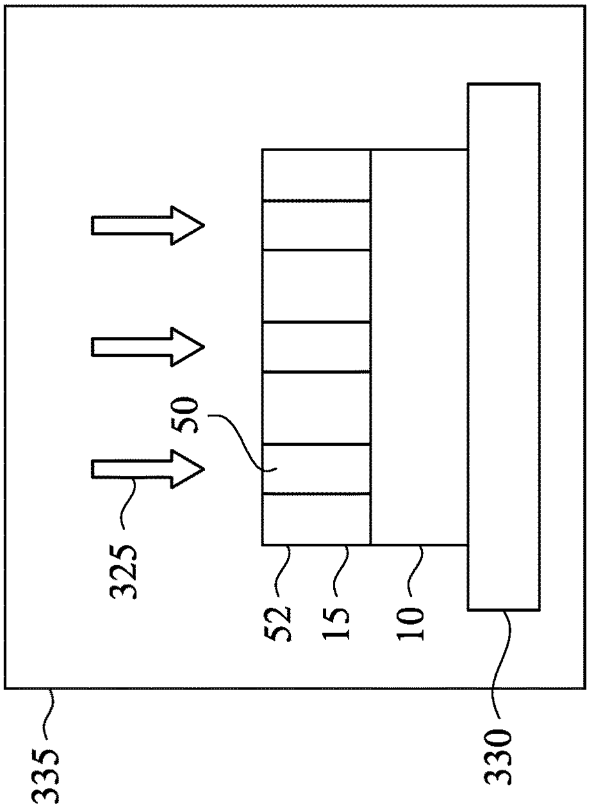
FIG. 6 shows a process stage of a sequential operation according to an embodiment of the disclosure.

In some embodiments, the base composition 325 is applied to the photoresist layer 15 in a base composition application operation S130*e* after the selective exposure to actinic radiation S150. In some embodiments, the base composition 325 is applied to the photoresist layer 15 during a post exposure baking (PEB) or cooling S160 in operation S130*f*, as shown in FIG. 6. In some embodiments, the photoresist layer 15 is heated or cooled at a temperature ranging from about −30° C. to about 300° C. during the post exposure baking or cooling operation S160. In some embodiments, the temperature is controlled using the heater/chiller 330 and a controller 260 (see FIGS. 16A, 16B). In some embodiments, the base composition application S130*f* is performed at a heating temperature ranging from about 50° C. to about 250° C., and in other embodiments, the heating temperature ranges from about 70° C. to about 200° C. In some embodiments, the base composition application S130*f* is performed at a cooling temperature ranging from about −15° C. to about 25° C., in other embodiments the cooling temperature ranges from about 0° C. to about 15° C. In some embodiments, the duration of the base composition application ranges from about 1 s to about 300 s. In other embodiments, the duration of the base composition application ranges from about 10 s to about 150 s. At temperatures and time durations below the disclosed ranges there may be insufficient base composition treatment of the photoresist layer. At temperatures and time durations greater than the disclosed ranges there may be damage to the photoresist layer 15 or other components of the semiconductor device. In some embodiments, the photoresist layer 15 is heated at a temperature ranging from about 50° C. to about 160° C. for about 20 s to about 120 s. The post-exposure baking may be used to assist in the generating, dispersing, and reacting of the acid/base/free radical generated from the impingement of the radiation 45/97 upon the doped photoresist layer 15 during the exposure. Such assistance helps to create or enhance chemical reactions, which generate chemical differences between the exposed region 50 and the unexposed region 52 within the photoresist layer.

The base composition 325 is applied to the photoresist layer 15 in a base composition application operation S130*g* after the post exposure baking/cooling operations S140 and before the developing S170 of the exposed photoresist layer 15 in some embodiments.

Figure 7:
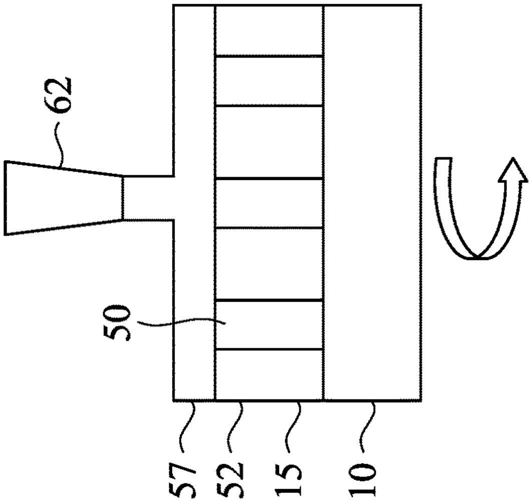
FIG. 7 shows a process stage of a sequential operation according to an embodiment of the disclosure.
Figure 8:
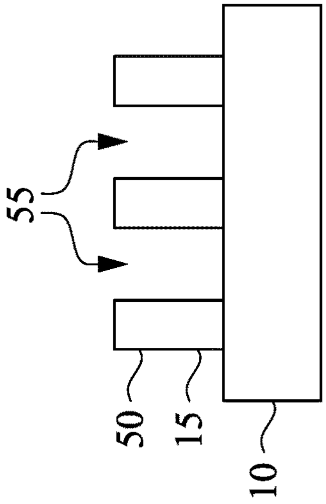
FIG. 8 shows a process stage of a sequential operation according to an embodiment of the disclosure.

The selectively exposed photoresist layer is subsequently developed by applying a developer to the selectively exposed photoresist layer in operation S170. As shown in FIG. 7, a developer 57 is supplied from a dispenser 62 to the photoresist layer 15. In some embodiments, the unexposed region 52 of the photoresist layer is removed by the developer 57 forming a pattern of openings 55 in the photoresist layer 15 to expose the substrate 10, as shown in FIG. 8.

Figure 9:
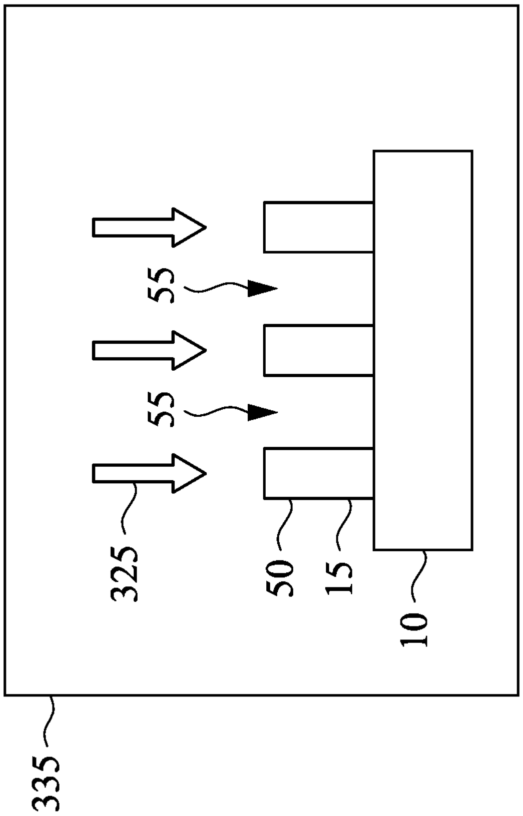
FIG. 9 shows a process stage of a sequential operation according to an embodiment of the disclosure.

The base composition 325 is applied to the developed photoresist layer 15 in a base composition application operation S130*h* after the developing operation S170 of the exposed photoresist layer 15 in some embodiments, as shown in FIG. 9. In other embodiments, the base composition 325 is mixed with the developer 57 in operation S180 to form a base composition/developer mixture, which is subsequently applied to the selectively exposed photoresist layer in operation S130*i*.

In some embodiments, the base composition 325 is uniformly distributed throughout the photoresist layer 15 or the patterned photoresist layer 50. In other embodiments, there is a gradient in the base composition distribution in the photoresist layer 15 ranging from a greater amount near the surface of the photoresist layer 15 or patterned photoresist layer 50 to a lower amount near a central portion of the photoresist layer 15 or patterned photoresist features 50.

Figure 10:
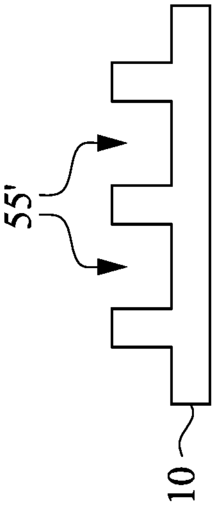
FIG. 10 shows a process stage of a sequential operation according to an embodiment of the disclosure.

In some embodiments, the pattern of openings 55 in the patterned photoresist layer 15 is extended into the substrate 10 to create a pattern of openings 55' in the substrate 10, thereby transferring the pattern in the photoresist layer 15 into the substrate 10, as shown in FIG. 10. The pattern is extended into the substrate by etching, using one or more suitable etchants. In some embodiments, the etching operation removes portions of the underlayer 20 still remaining if base composition is not completely diffused into the photoresist layer. The photoresist layer pattern 50 is at least partially removed during the etching operation in some embodiments. In other embodiments, the photoresist layer pattern 50 and any remaining portions of the underlayer 20 under the photoresist layer pattern 50 are removed after etching the substrate 10 by using a suitable photoresist stripper solvent or by a photoresist ashing operation.

The base composition 325 may be applied to the photoresist layer 15 during any of the base composition application operations S130*a*, S130*b*, S130*c*, S130*d*, S130*e*, S130*f*, S130*g*, S130*h*, or S130*i*. In some embodiments, the base composition is applied to the photoresist layer 15 a plurality of times during any combination of the base composition application operations S130*a*, S130*b*, S130*c*, S130*d*, S130*e*, S130*f*, S130*g*, S130*h*, and S130*i*, including at each of the base composition application operations S130*a*-S130*i*. Any of the base composition application operations or any combination of the base composition application operations S130*a*, S130*b*, S130*c*, S130*d*, S130*e*, S130*f*, S130*g*, S130*h*, and S130*i* may be performed in a chamber 335, such as a vacuum chamber. In some embodiments, the chamber 335 is used for another semiconductor device processing operation, including: forming the photoresist layer S120, pre-exposure baking/cooling S140, post-exposure baking/cooling S160, or developing S170. In some embodiments, the duration of the base composition application ranges from about 1 s to about 300 s. In other embodiments, the duration of the base composition application ranges from about 10 s to about 150 s.

The base composition 325 is a solution with a pH>7, and includes one or more of following solutions a-d in some embodiments: (a) a non-organic base dissolved in water or a suitable solvent, (b) an organic base, (c) a thermal base generator (TBG), and d) a photobase generator (PBG). In some embodiments, the non-organic base, organic base, TBG, or PBG are dissolved in a suitable solvent at an amount of about 1 ppm to about 90 wt. % based on the total weight of the base or base generator and the solvent. In some embodiments, the non-organic base, organic base, TBG, or PBG are dissolved in the suitable solvent or water at an amount of about 100 ppm to about 80 wt. % based on the total weight of the base or base generator and the solvent. In other embodiments the amount of the base, TBG, or PBG is about 1 wt. % to about 70 wt. %, and in other embodiments, the amount of the base is about 10 wt. % to about 50 wt. % based on the total weight of the base or base generator and the solvent.

In some embodiments, the base, TBG, or PBG concentration in the solvent is optimized based on the lithographic performance of the base composition/photoresist composition pairing. In some embodiments, at higher base, TBG, or PBG concentrations a greater improvement in line width roughness (LWR) and reduction in the exposure dose (EOP) (increased photoresist sensitivity) is achieved. However, in some embodiments, increased base, TBG, or PBG concentrations increase the cost of the semiconductor manufacturing process.

In some embodiments, the base composition 325 is applied to the photoresist layer 15 in the form of a liquid, such as a rinse operation. In other embodiments, the base composition 325 is applied to the photoresist layer 15 in the form of a vapor (e.g.—atomized liquid into fine droplets), or a gas. In some embodiments, the base composition 325 is applied to the photoresist layer 15 by a spin coating technique. In other embodiments, the base composition 325 is applied by a spray coating technique. In other embodiments, the photoresist layer 15 is dipped or immersed in a liquid solution of the base composition 325. In some embodiments, the base composition 325 is applied in a chamber 335 by a vapor phase deposition technique, including chemical vapor deposition (CVD), physical vapor deposition (PVD), and atomic layer deposition (ALD). In some embodiments, a gas purge of the chamber 335 is performed before the base composition 325 is applied to the photoresist layer 15. In some embodiments, the chamber is purged with one or more of carbon dioxide, nitrogen, helium, neon, argon, or dry air, where dry air has a dewpoint of about −40° C. or lower. In other embodiments, the humidity of the purge air is varied depending on process requirements, to between about 0 to about 100% relative humidity.

In some embodiments, the non-organic base for the base composition 325 includes one or more selected from the groups consisting of NaOH, KOH, LiOH, $Ca(OH)_2$, $Ba(OH)_2$, $Na_2CO_3$, $NH_4OH$, $Mg(OH)_2$, RbOH, CsOH, $Sr(OH)_2$, $NH_3$, ammonium hydroxide, and ammonium sulfamate.

Figure 11A:
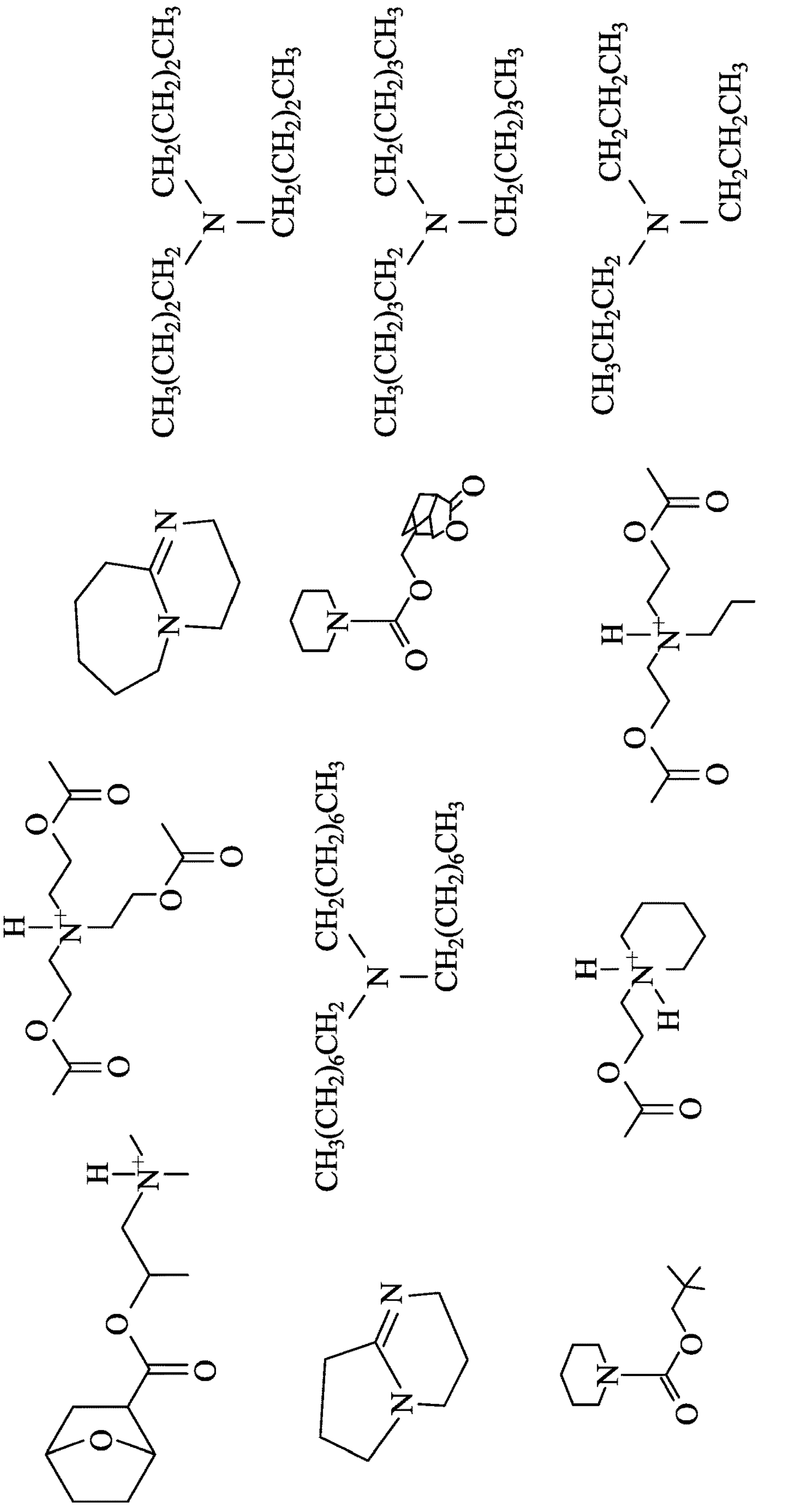
FIGS. 11A and 11B illustrate examples of organic bases according to embodiments of the disclosure.
Figure 11B:
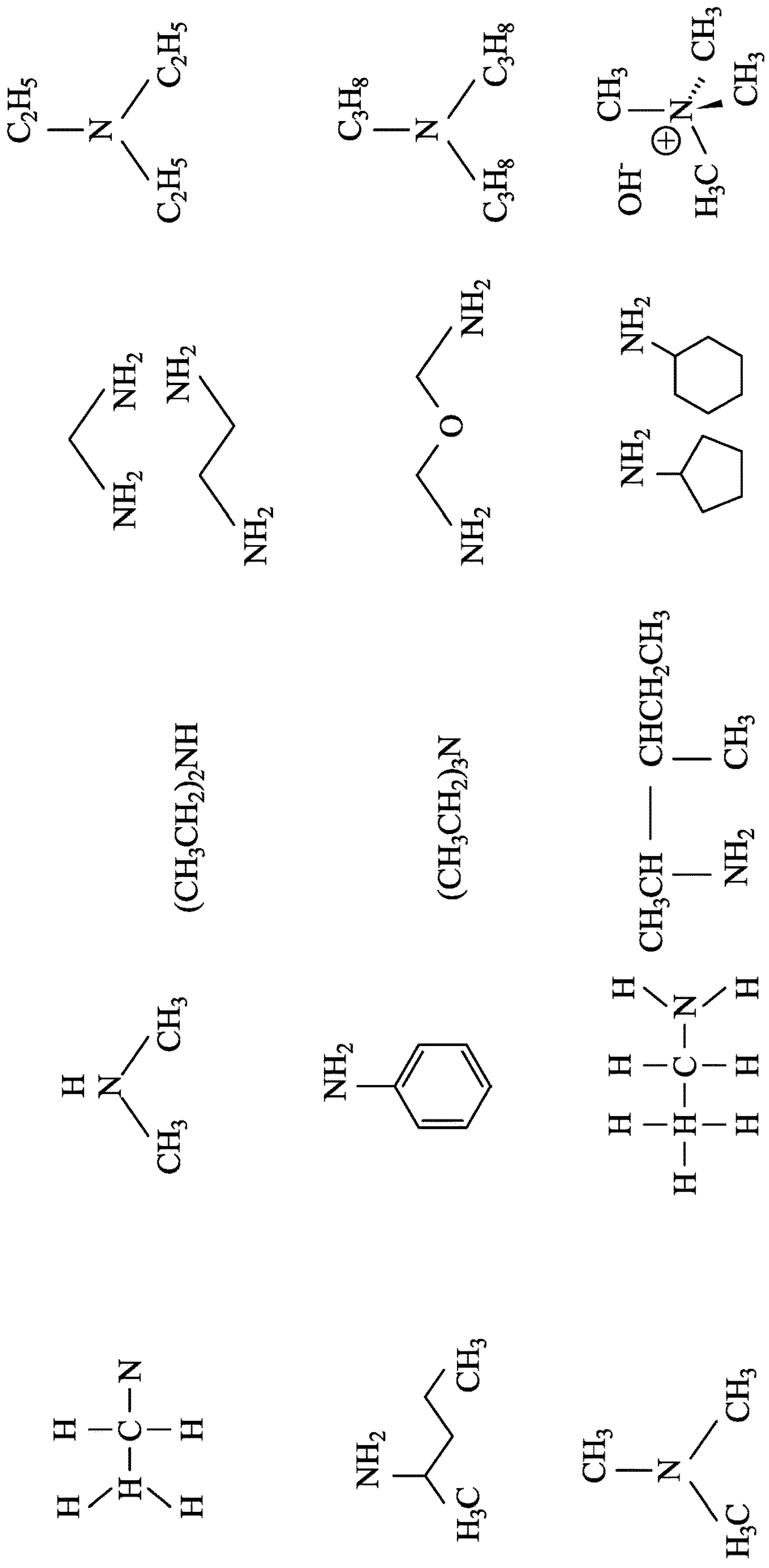

In some embodiments, the organic base for the base composition 325 includes one or more selected from the group consisting of monoethanolamine, monoisopropanolamine, 2-amino-2-methyl-1-propanol, 1H-benzotriazole, 1,2,4-triazole, 1,8-diazabicycloundec-7-ene, tetrabutylammonium hydroxide, tetramethylammonium hydroxide, ammonium carbamate, tetraethylammonium hydroxide, tetrapropylammonium hydroxide, $(NH)R_2$, $NH_2R$, $NR_3$, $C_3H_5O_2NH_2$, $CH_3O_2NH_2$, $NH_2CH_2NH_2$, $NH_2C_2H_4NH_2$, $(NH_2)_xR_x$, $(NH_2)_xO_2R_x$, and $(NH_2)_xOR_x$, where x=1-8 and R is a hydrocarbon having 1 to 15 carbons. In some embodiments, the organic base is one or more of the compounds in illustrated in FIGS. 11A and 11B.

Figure 12:
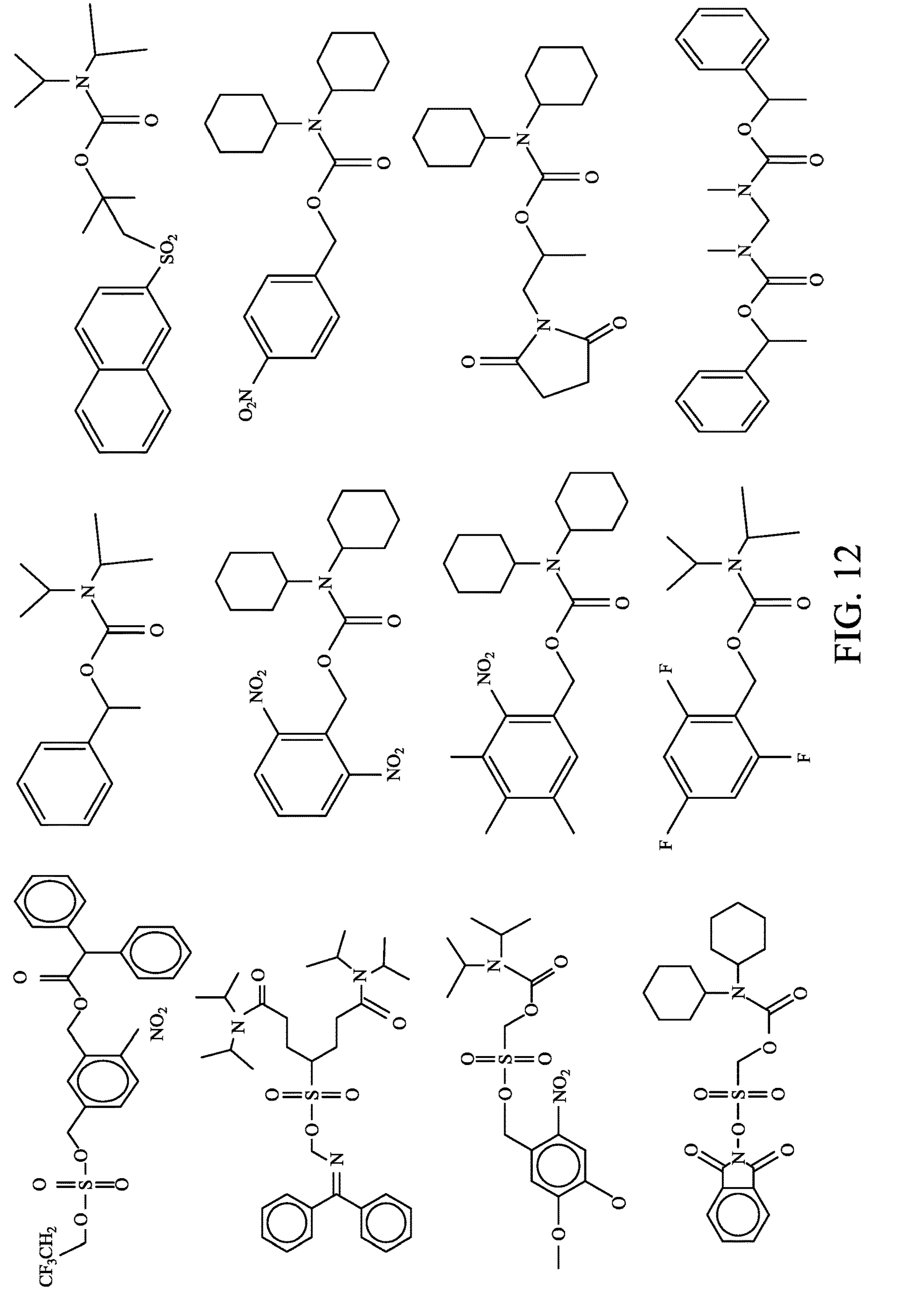
FIG. 12 illustrates examples of photobase generators according to embodiments of the disclosure.

In some embodiments, the base is a photobase generator (PBG). In some embodiments, the PBG is a quaternary ammonium dithiocarbamate, an α aminoketones, an oxime-urethane containing molecule such as dibenzophenoneoxime hexamethylene diurethan, ammonium tetraorganylborate salts, or N-(2-nitrobenzyloxycarbonyl)cyclic amines. In some embodiments, the PBG is one or more of the compounds illustrated in FIG. 12. In some embodiments, the PBG is activated at an exposure dose of about 20 $mJ/cm^2$ to about 100 $mJ/cm^2$.

Figure 13:
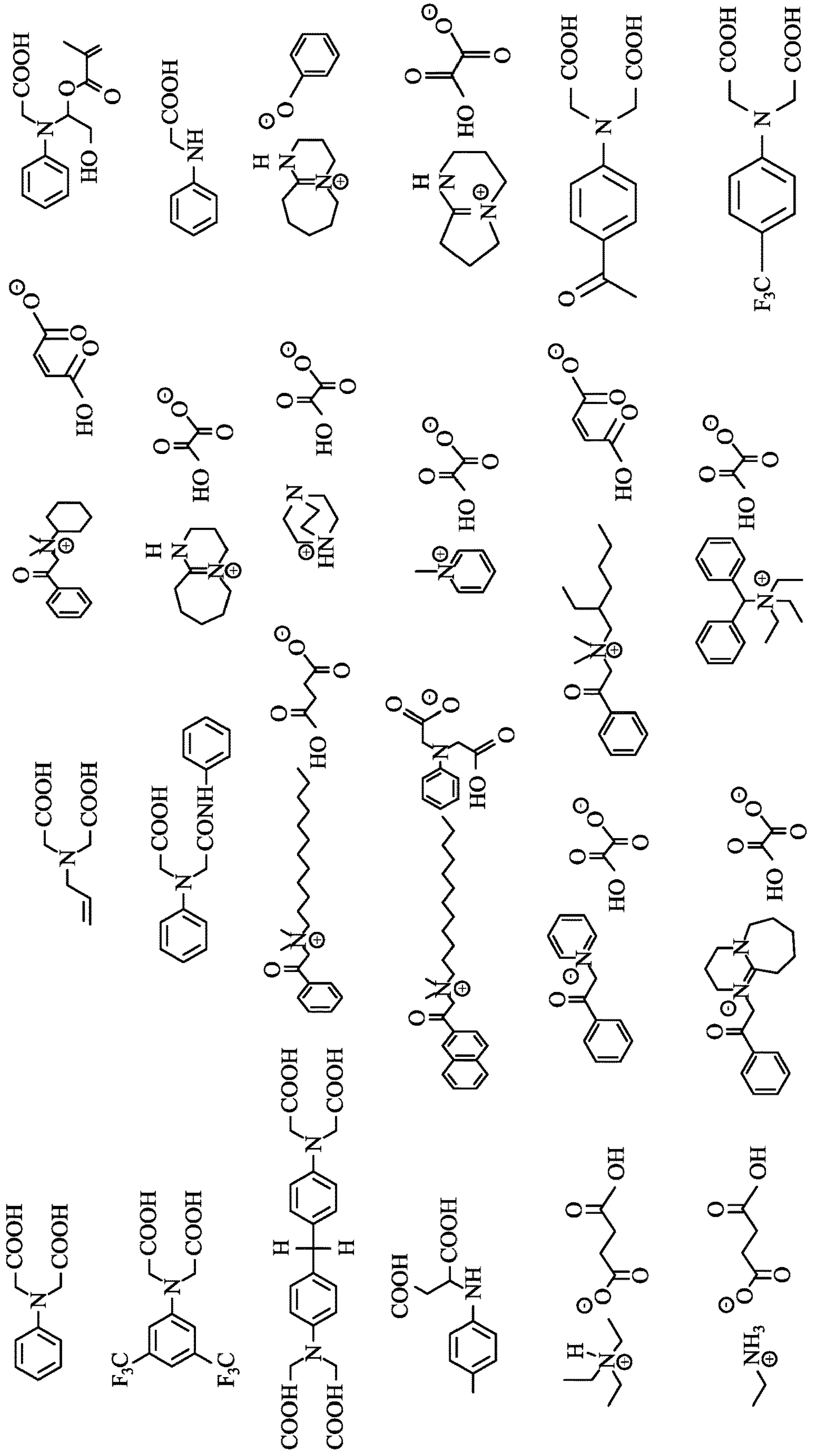
FIG. 13 illustrates examples of thermal base generators according to embodiments of the disclosure.

In some embodiments, the TBG is one or more compounds illustrated in FIG. 13. In some embodiments, the TBG is activated at a temperature of about 50° C. to about 300° C. In some embodiments, the solvent is selected based on the dissolution rate of the base. Suitable solvents for the base composition include one or more selected from the group consisting of acetonitrile, acetic acid, propylene glycol methyl ether acetate (PGMEA), propylene glycol monomethyl ether (PGME), 1-ethoxy-2-propanol (PGEE), gamma-butyrolactone (GBL), cyclohexanone (CHN), ethyl lactate (EL), methanol, ethanol, propanol, n-butanol, acetone, dimethylformamide (DMF), isopropyl alcohol (IPA), tetrahydrofuran (THF), methyl isobutyl carbinol (MIBC), n-butyl acetate (nBA), 2-heptanone (MAK), 5-15 carbon alkyl chain solvents, including n-pentane, cyclohexane, 2,2-dimethylpentane, 2,4-dimethylpentane, and the like.

The base composition 325 may be a solution that is a mixture of water and a solvent, where the amount of water ranges from about 1 ppm to about 99 wt. % based on the total weight of the solution. In other embodiments, the amount of water ranges from about 1 wt. % to about 90 wt. %, and in other embodiments, the amount of water ranges from about 10 wt. % to about 75 wt. % based on the total weight of the solution.

In FIGS. 2-10, in some embodiments, the substrate 10 includes a single crystalline semiconductor layer on at least it surface portion. The substrate 10 may include a single crystalline semiconductor material such as, but not limited to Si, Ge, SiGe, GaAs, InSb, GaP, GaSb, InAlAs, InGaAs, GaSbP, GaAsSb and InP. In some embodiments, the substrate 10 is a silicon layer of an SOI (silicon-on insulator) substrate. In certain embodiments, the substrate 10 is made of crystalline Si.

The substrate 10 may include in its surface region, one or more buffer layers (not shown). The buffer layers can serve to gradually change the lattice constant from that of the substrate to that of subsequently formed source/drain regions. The buffer layers may be formed from epitaxially grown single crystalline semiconductor materials such as, but not limited to Si, Ge, GeSn, SiGe, GaAs, InSb, GaP, GaSb, InAlAs, InGaAs, GaSbP, GaAsSb, GaN, GaP, and InP. In an embodiment, the silicon germanium (SiGe) buffer layer is epitaxially grown on the silicon substrate 10. The germanium concentration of the SiGe buffer layers may increase from 30 atomic % for the bottom-most buffer layer to 70 atomic % for the top-most buffer layer.

In some embodiments, the substrate 10 includes one or more layers of at least one metal, metal alloy, and metal nitride sulfide/oxide/silicide having the formula $MX_a$, where M is a metal and X is N, S, Se, O, Si, and a is from about 0.4 to about 2.5. In some embodiments, the substrate 10 includes titanium, aluminum, cobalt, ruthenium, titanium nitride, tungsten nitride, tantalum nitride, and combinations thereof.

In some embodiments, the substrate 10 includes a dielectric having at least a silicon or metal oxide or nitride of the formula $MX_b$, where M is a metal or Si, X is N or O, and b ranges from about 0.4 to about 2.5. In some embodiments, the substrate 10 includes silicon dioxide, silicon nitride, aluminum oxide, hafnium oxide, lanthanum oxide, and combinations thereof.

The photoresist layer 15 is a photosensitive layer that is patterned by exposure to actinic radiation. Typically, the chemical properties of the photoresist regions struck by incident radiation change in a manner that depends on the type of photoresist used. Photoresist layers 15 may be positive tone resists or negative tone resists. A positive tone resist refers to a photoresist material that when exposed to actinic radiation (e.g., UV light) becomes soluble in a developer, while the region of the photoresist that is non-exposed (or exposed less) is insoluble in the developer. A negative tone resist, on the other hand, refers to a photoresist material that when exposed to actinic radiation becomes insoluble in the developer, while the region of the photoresist that is non-exposed (or exposed less) is soluble in the developer. The region of a negative tone resist that becomes insoluble upon exposure to radiation may become insoluble due to a cross-linking reaction caused by the exposure to radiation. In some embodiments, the resist is a negative tone developed (NTD) resist. In an NTD resist, the portions of the photoresist layer exposed to actinic radiation do not cross-link, however, developer is selected to selectively dissolve the unexposed portions of the photoresist layer, so that the exposed portions remain on the substrate.

In some embodiments of the present disclosure, a negative tone photoresist is exposed to actinic radiation. The exposed portions of the negative tone photoresist undergo crosslinking because of the exposure to actinic radiation, and during development the unexposed, non-crosslinked portions of the photoresist are removed by the developer leaving the exposed regions of the photoresist remaining on the substrate. In other embodiments, an NTD resist used, wherein the exposed portions of the photoresist undergo a chemical reaction reducing the solubility of the exposed portions in the developer.

Photoresist compositions used in some embodiments according to the present disclosure include a polymer along with one or more photoactive compounds (PACs) in a solvent. In some embodiments, the polymer includes a hydrocarbon structure (such as an alicyclic hydrocarbon structure) that contains one or more groups that will decompose (e.g., acid labile groups) or otherwise react when mixed with acids, bases, or free radicals generated by the PACs (as further described below). In some embodiments, the hydrocarbon structure includes a repeating unit that forms a skeletal backbone of the polymer. This repeating unit may include acrylic esters, methacrylic esters, crotonic esters, vinyl esters, maleic diesters, fumaric diesters, itaconic diesters, (meth)acrylonitrile, (meth)acrylamides, styrenes, vinyl ethers, combinations of these, or the like.

In some embodiments, the photoresist includes a polymer having acid labile groups selected from the following:

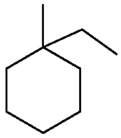,
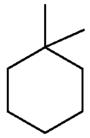,
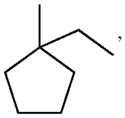,
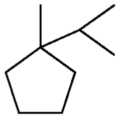,
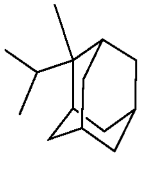,
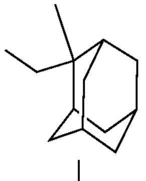,
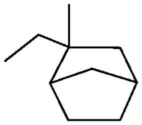, and
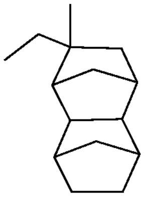.

Specific structures that are utilized for the repeating unit of the hydrocarbon structure in some embodiments, include one or more of methyl acrylate, ethyl acrylate, n-propyl acrylate, isopropyl acrylate, n-butyl acrylate, isobutyl acrylate, tert-butyl acrylate, n-hexyl acrylate, 2-ethylhexyl acrylate, acetoxyethyl acrylate, phenyl acrylate, 2-hydroxyethyl acrylate, 2-methoxyethyl acrylate, 2-ethoxyethyl acrylate, 2-(2-methoxyethoxy)ethyl acrylate, cyclohexyl acrylate, benzyl acrylate, 2-alkyl-2-adamantyl (meth)acrylate or dialkyl(1-adamantyl)methyl (meth)acrylate, methyl methacrylate, ethyl methacrylate, n-propyl methacrylate, isopropyl methacrylate, n-butyl methacrylate, isobutyl methacrylate, tert-butyl methacrylate, n-hexyl methacrylate, 2-ethylhexyl methacrylate, acetoxyethyl methacrylate, phenyl methacrylate, 2-hydroxyethyl methacrylate, 2-methoxyethyl methacrylate, 2-ethoxyethyl methacrylate, 2-(2-methoxyethoxy) ethyl methacrylate, cyclohexyl methacrylate, benzyl methacrylate, 3-chloro-2-hydroxypropyl methacrylate, 3-acetoxy-2-hydroxypropyl methacrylate, 3-chloroacetoxy-2-hydroxypropyl methacrylate, butyl crotonate, hexyl crotonate, or the like. Examples of the vinyl esters include vinyl acetate, vinyl propionate, vinyl butylate, vinyl methoxyacetate, vinyl benzoate, dimethyl maleate, diethyl maleate, dibutyl maleate, dimethyl fumarate, diethyl fumarate, dibutyl fumarate, dimethyl itaconate, diethyl itaconate, dibutyl itaconate, acrylamide, methyl acrylamide, ethyl acrylamide, propyl acrylamide, n-butyl acrylamide, tert-butyl acrylamide, cyclohexyl acrylamide, 2-methoxyethyl acrylamide, dimethyl acrylamide, diethyl acrylamide, phenyl acrylamide, benzyl acrylamide, methacrylamide, methyl methacrylamide, ethyl methacrylamide, propyl methacrylamide, n-butyl methacrylamide, tert-butyl methacrylamide, cyclohexyl methacrylamide, 2-methoxyethyl methacrylamide, dimethyl methacrylamide, diethyl methacrylamide, phenyl methacrylamide, benzyl methacrylamide, methyl vinyl ether, butyl vinyl ether, hexyl vinyl ether, methoxyethyl vinyl ether, dimethylaminoethyl vinyl ether, or the like. Examples of styrenes include styrene, methyl styrene, dimethyl styrene, trimethyl styrene, ethyl styrene, isopropyl styrene, butyl styrene, methoxy styrene, butoxy styrene, acetoxy styrene, chloro styrene, dichloro styrene, bromo styrene, vinyl methyl benzoate, a-methyl styrene, maleimide, vinylpyridine, vinylpyrrolidone, vinylcarbazole, combinations of these, or the like.

In some embodiments, the repeating unit of the hydrocarbon structure also has either a monocyclic or a polycyclic hydrocarbon structure substituted into it, or the monocyclic or polycyclic hydrocarbon structure is the repeating unit, in order to form an alicyclic hydrocarbon structure. Specific examples of monocyclic structures in some embodiments include bicycloalkane, tricycloalkane, tetracycloalkane, cyclopentane, cyclohexane, or the like. Specific examples of polycyclic structures in some embodiments include adamantane, norbornane, isobornane, tricyclodecane, tetracyclododecane, or the like.

The group which will decomposes attached to the hydrocarbon structure so that it will react with the acids/bases/free radicals generated by the PACs during exposure. Groups that react with acids are known as acid labile groups. In some embodiments, the group which will decompose is a carboxylic acid group, a fluorinated alcohol group, a phenolic alcohol group, a sulfonic group, a sulfonamide group, a sulfonylimido group, an (alkylsulfonyl) (alkylcarbonyl)methylene group, an (alkylsulfonyl)(alkyl-carbonyl)imido group, a bis(alkylcarbonyl)methylene group, a bis(alkylcarbonyl)imido group, a bis(alkylsylfonyl)methylene group, a bis(alkylsulfonyl)imido group, a tris(alkylcarbonyl methylene group, a tris(alkylsulfonyl)methylene group, combinations of these, or the like. Specific groups that are used for the fluorinated alcohol group include fluorinated hydroxyalkyl groups, such as a hexafluoroisopropanol group in some embodiments. Specific groups that are used for the carboxylic acid group include acrylic acid groups, methacrylic acid groups, or the like.

In some embodiments, the acid labile group (ALG) decomposes by the action of the acid generated by the photoacid generator leaving a carboxylic acid group pendant to the polymer resin chain, as shown in the ALG de-protect reaction:

ALG de-protect reaction

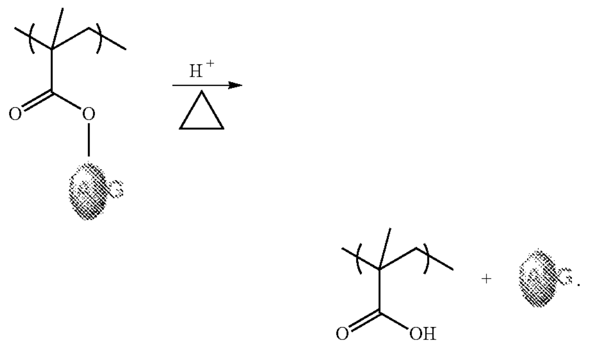

In some embodiments, the polymer also includes other groups attached to the hydrocarbon structure that help to improve a variety of properties of the polymerizable resin. For example, inclusion of a lactone group to the hydrocarbon structure assists to reduce the amount of line edge roughness after the photoresist has been developed, thereby helping to reduce the number of defects that occur during development. In some embodiments, the lactone groups include rings having five to seven members, although any suitable lactone structure may alternatively be used for the lactone group.

In some embodiments, a crosslinker is added to the photoresist. The crosslinker reacts with one group from one of the hydrocarbon structures in the polymer resin and also reacts with a second group from a separate one of the hydrocarbon structures in order to crosslink and bond the two hydrocarbon structures together. This bonding and crosslinking increases the molecular weight of the polymer products of the crosslinking reaction and increases the overall linking density of the photoresist. Such an increase in density and linking density helps to improve the resist pattern.

In some embodiments, the crosslinker has the following structure:

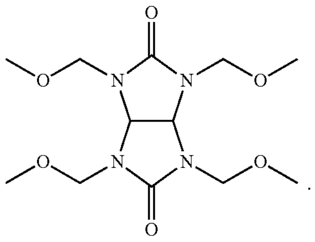

In other embodiments, the crosslinker has the following structure:

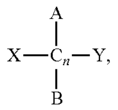

wherein C is carbon, n ranges from 1 to 15; A and B independently include a hydrogen atom, a hydroxyl group, a halide, an aromatic carbon ring, or a straight or cyclic alkyl, alkoxyl/fluoro, alkyl/fluoroalkoxyl chain having a carbon number of between 1 and 12, and each carbon C contains A and B; a first terminal carbon C at a first end of a carbon C chain includes X and a second terminal carbon C at a second end of the carbon chain includes Y, wherein X and Y independently include an amine group, a thiol group, a hydroxyl group, an isopropyl alcohol group, or an isopropyl amine group, except when n=1 then X and Y are bonded to the same carbon C. Specific examples of materials that may be used as the crosslinker include the following:

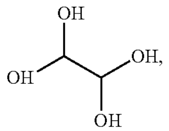

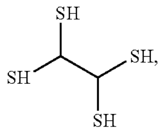

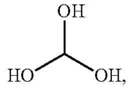

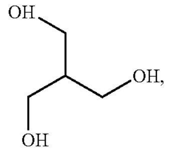

-continued

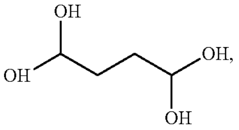

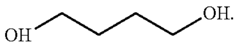

Alternatively, instead of or in addition to the crosslinker being added to the photoresist composition, a coupling reagent is added in some embodiments, in which the coupling reagent is added in addition to the crosslinker. The coupling reagent assists the crosslinking reaction by reacting with the groups on the hydrocarbon structure in the polymer resin before the crosslinker reagent, allowing for a reduction in the reaction energy of the cross-linking reaction and an increase in the rate of reaction. The bonded coupling reagent then reacts with the crosslinker, thereby coupling the crosslinker to the polymer resin.

Alternatively, in some embodiments in which the coupling reagent is added to the photoresist composition without the crosslinker, the coupling reagent is used to couple one group from one of the hydrocarbon structures in the polymer resin to a second group from a separate one of the hydrocarbon structures in order to cross-link and bond the two polymers together. However, in such an embodiment the coupling reagent, unlike the crosslinker, does not remain as part of the polymer, and only assists in bonding one hydrocarbon structure directly to another hydrocarbon structure.

In some embodiments, the coupling reagent has the following structure:

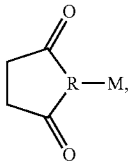

where R is a carbon atom, a nitrogen atom, a sulfur atom, or an oxygen atom; M includes a chlorine atom, a bromine atom, an iodine atom, —$NO_2$; —$SO_3$—; —H—; —CN; —NCO, —OCN; —$CO_2$—; —OH; —OR*, —OC(O)CR*; —SR, —$SO_2N(R^*)_2$; —$SO_2R^*$; SOR; —OC(O)R*; —C(O)OR*; —C(O)R*; —$Si(OR^*)_3$; —$Si(R^*)_3$; epoxy groups, or the like; and R* is a substituted or unsubstituted $C_1$-$C_{12}$ alkyl, $C_1$-$C_{12}$ aryl, $C_1$-$C_{12}$ aralkyl, or the like. Specific examples of materials used as the coupling reagent in some embodiments include the following:

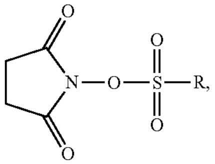

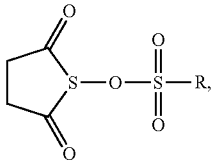

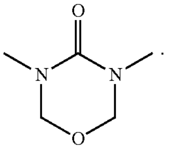

The individual components of the photoresist are placed into a solvent in order to aid in the mixing and dispensing of the photoresist. To aid in the mixing and dispensing of the photoresist, the solvent is chosen at least in part based upon the materials chosen for the polymer resin as well as the PACs. In some embodiments, the solvent is chosen such that the polymer resin and the PACs can be evenly dissolved into the solvent and dispensed upon the layer to be patterned.

In some embodiments, the polymer includes groups that can assist in increasing the adhesiveness of the photoresist layer 15 to underlying structures (e.g., substrate 10). Polar groups may be used to help increase the adhesiveness. Suitable polar groups include hydroxyl groups, cyano groups, or the like, although any suitable polar group may, alternatively, be used.

Optionally, the polymer includes one or more alicyclic hydrocarbon structures that do not also contain a group which will decompose in some embodiments. In some embodiments, the hydrocarbon structure that does not contain a group which will decompose includes structures such as 1-adamantyl(meth)acrylate, tricyclodecanyl (meth)acrylate, cyclohexyl (methacrylate), combinations of these, or the like. In some embodiments, the photoresist composition includes one or more photoactive compounds (PAC).

In some embodiments, the PACs include photoacid generators, photobase generators, photo decomposable bases, free-radical generators, or the like. In some embodiments in which the PACs are photoacid generators, the PACs include halogenated triazines, onium salts, diazonium salts, aromatic diazonium salts, phosphonium salts, sulfonium salts, iodonium salts, imide sulfonate, oxime sulfonate, diazodisulfone, disulfone, o-nitrobenzylsulfonate, sulfonated esters, halogenated sulfonyloxy dicarboximides, diazodisulfones, α-cyanooxyamine-sulfonates, imidesulfonates, ketodiazosulfones, sulfonyldiazoesters, 1,2-di(arylsulfonyl)hydrazines, nitrobenzyl esters, and the s-triazine derivatives, combinations of these, or the like.

Specific examples of photoacid generators include α-(trifluoromethylsulfonyloxy)-bicyclo[2.2.1]hept-5-ene-2,3-dicarb-o-ximide (MDT), N-hydroxy-naphthalimide (DDSN), benzoin tosylate, t-butylphenyl-α-(p-toluenesulfonyloxy)-acetate and t-butyl-α-(p-toluenesulfonyloxy)-acetate, triarylsulfonium and diaryliodonium hexafluoroantimonates, hexafluoroarsenates, trifluoromethanesulfonates, iodonium perfluorooctanesulfonate, N-camphorsulfonyloxynaphthalimide, N-pentafluorophenylsulfonyloxynaphthalimide, ionic iodonium sulfonates such as diaryl iodonium (alkyl or aryl)sulfonate and bis-(di-t-butylphenyl)iodonium camphanylsulfonate, perfluoroalkanesulfonates such as perfluoropentanesulfonate, perfluorooctanesulfonate, perfluoromethanesulfonate, aryl (e.g., phenyl or benzyl)triflates such as triphenylsulfonium triflate or bis-(t-butylphenyl)iodonium triflate; pyrogallol derivatives (e.g., trimesylate of pyrogallol), trifluoromethanesulfonate esters of hydroxyimides, α,α'-bis-sulfonyl-diazomethanes, sulfonate esters of nitro-substituted benzyl alcohols, naphthoquinone-4-diazides, alkyl disulfones, or the like.

In some embodiments in which the PACs are free-radical generators, the PACs include n-phenylglycine; aromatic ketones, including benzophenone, N,N'-tetramethyl-4,4'-diaminobenzophenone, N,N'-tetraethyl-4,4'-diaminobenzophenone, 4-methoxy-4'-dimethylaminobenzo-phenone, 3,3'-dimethyl-4-methoxybenzophenone, p,p'-bis(dimethylamino)benzo-phenone, p,p'-bis(diethylamino)-benzophenone; anthraquinone, 2-ethylanthraquinone; naphthaquinone; and phenanthraquinone; benzoins including benzoin, benzoinmethylether, benzoinisopropylether, benzoin-n-butylether, benzoin-phenylether, methylbenzoin and ethylbenzoin; benzyl derivatives, including dibenzyl, benzyldiphenyldisulfide, and benzyldimethylketal; acridine derivatives, including 9-phenylacridine, and 1,7-bis(9-acridinyl)heptane; thioxanthones, including 2-chlorothioxanthone, 2-methylthioxanthone, 2,4-diethylthioxanthone, 2,4-dimethylthioxanthone, and 2-isopropylthioxanthone; acetophenones, including 1,1-dichloroacetophenone, p-t-butyldichloro-acetophenone, 2,2-diethoxyacetophenone, 2,2-dimethoxy-2-phenylacetophenone, and 2,2-dichloro-4-phenoxyacetophenone; 2,4,5-triarylimidazole dimers, including 2-(o-chlorophenyl)-4,5-diphenylimidazole dimer, 2-(o-chlorophenyl)-4,5-di-(m-methoxyphenyl imidazole dimer, 2-(o-fluorophenyl)-4,5-diphenylimidazole dimer, 2-(o-methoxyphenyl)-4,5-diphenylimidazole dimer, 2-(p-methoxyphenyl)-4,5-diphenylimidazole dimer, 2,4-di(p-methoxyphenyl)-5-phenylimidazole dimer, 2-(2,4-dimethoxyphenyl)-4,5-diphenylimidazole dimer and 2-(p-methylmercaptophenyl)-4,5-diphenylimidazole dimmer; combinations of these, or the like.

In some embodiments, the solvent is an organic solvent, and includes one or more of any suitable solvent such as ketones, alcohols, polyalcohols, ethers, glycol ethers, cyclic ethers, aromatic hydrocarbons, esters, propionates, lactates, lactic esters, alkylene glycol monoalkyl ethers, alkyl lactates, alkyl alkoxypropionates, cyclic lactones, monoketone compounds that contain a ring, alkylene carbonates, alkyl alkoxyacetate, alkyl pyruvates, lactate esters, ethylene glycol alkyl ether acetates, diethylene glycols, propylene glycol alkyl ether acetates, alkylene glycol alkyl ether esters, alkylene glycol monoalkyl esters, or the like.

The photoresist compositions may also include a number of other additives that assist the photoresist to obtain high resolution. For example, some embodiments of the photoresist also includes surfactants in order to help improve the ability of the photoresist to coat the surface on which it is applied. Other additives added to some embodiments of the photoresist is a stabilizer, which assists in preventing undesired diffusion of the acids generated during exposure of the photoresist; a dissolution inhibitor to help control dissolution of the photoresist during development; a plasticizer, to reduce delamination and cracking between the photoresist and underlying layers (e.g., the layer to be patterned); and an adhesion promoter.

In some embodiments, the photoresist layer 15 is a negative tone metallic photoresist that undergoes a cross-linking reaction upon exposure to the radiation.

Figure 14A:
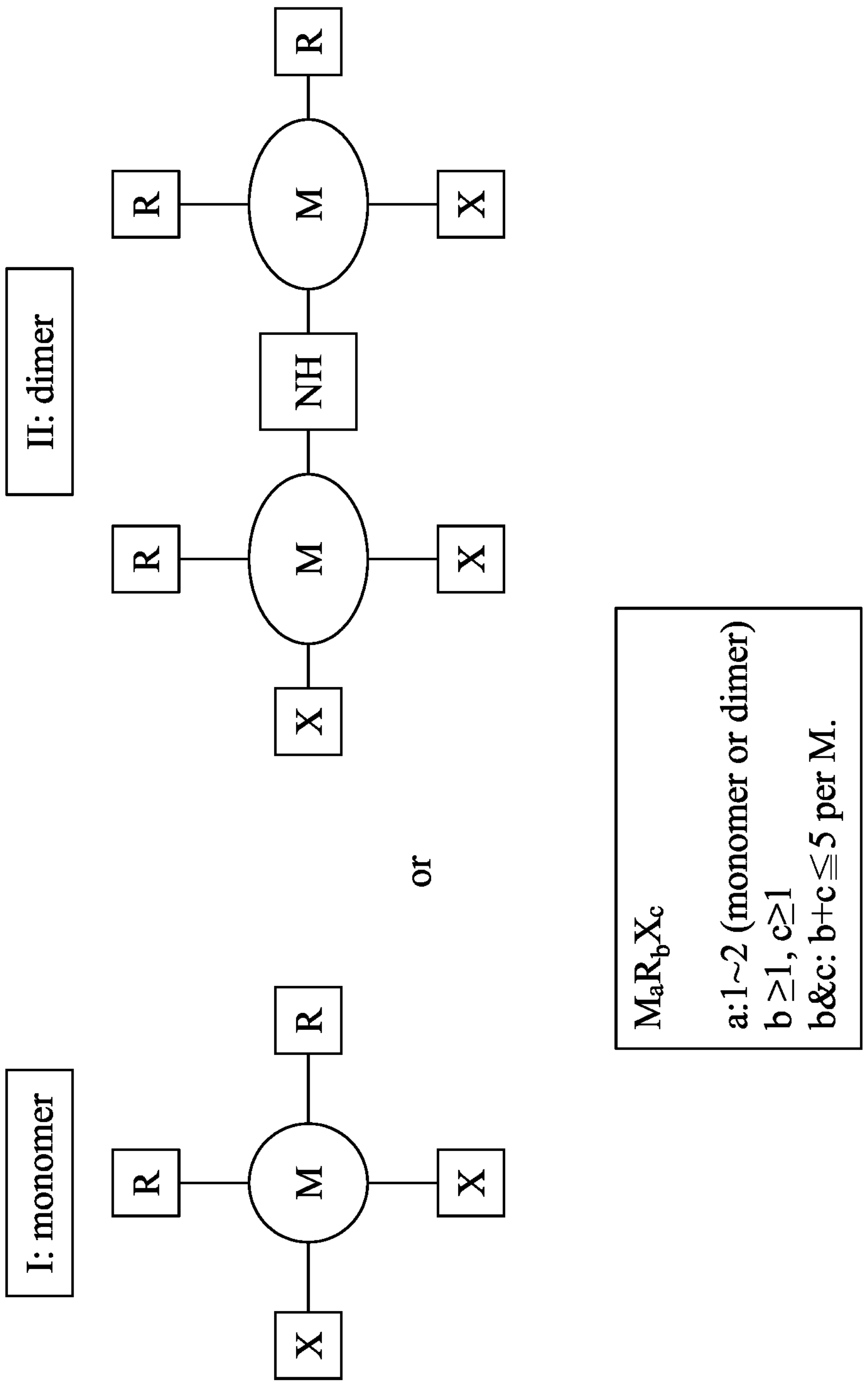
FIG. 14A shows organometallic precursors according to embodiments of the disclosure.

In some embodiments, the photoresist layer 15 is made of a metallic photoresist composition, including a first compound or a first precursor and a second compound or a second precursor combined in a vapor state. The first precursor or first compound is an organometallic having a formula: $M_aR_bX_c$, as shown in FIG. 14A, where M is at least one of Sn, Bi, Sb, In, Te, Ti, Zr, Hf, V, Co, Mo, W, Al, Ga, Si, Ge, P, As, Y, La, Ce, or Lu; and R is a substituted or unsubstituted alkyl, alkenyl, or carboxylate group. In some embodiments, M is selected from the group consisting of Sn, Bi, Sb, In, Te, and combinations thereof. In some embodiments, R is a $C_3$-$C_6$ alkyl, alkenyl, or carboxylate. In some embodiments, R is selected from the group consisting of propyl, isopropyl, butyl, iso-butyl, sec-butyl, tert-butyl, pentyl, isopentyl, sec-pentyl, tert-pentyl, hexyl, iso-hexyl, sec-hexyl, tert-hexyl, and combinations thereof. X is a ligand, ion, or other moiety, which is reactive with the second compound or second precursor; and $1 \leq a \leq 2$, $b \geq 1$, $c \geq 1$, and $b+c \leq 5$ in some embodiments. In some embodiments, the alkyl, alkenyl, or carboxylate group is substituted with one or more fluoro groups. In some embodiments, the organometallic precursor is a dimer, as shown in FIG. 14A, where each monomer unit is linked by an amine group. Each monomer has a formula: $M_aR_bX_c$, as defined above.

In some embodiments, R is alkyl, such as $C_nH_{2n+1}$ where $n \geq 3$. In some embodiments, R is fluorinated, e.g., having the formula $C_nF_xH_{((2n+1)-x)}$. In some embodiments, R has at least one beta-hydrogen or beta-fluorine. In some embodiments, R is selected from the group consisting of i-propyl, n-propyl, t-butyl, i-butyl, n-butyl, sec-butyl, n-pentyl, i-pentyl, t-pentyl, and sec-pentyl, and combinations thereof.

In some embodiments, X is any moiety readily displaced by the second compound or second precursor to generate an M-OH moiety, such as a moiety selected from the group consisting of amines, including dialkylamino and monalkylamino; alkoxy; carboxylates, halogens, and sulfonates. In some embodiments, the sulfonate group is substituted with one or more amine groups. In some embodiments, the halide is one or more selected from the group consisting of F, Cl, Br, and I. In some embodiments, the sulfonate group includes a substituted or unsubstituted $C_1$-$C_3$ group.

Figure 14B:
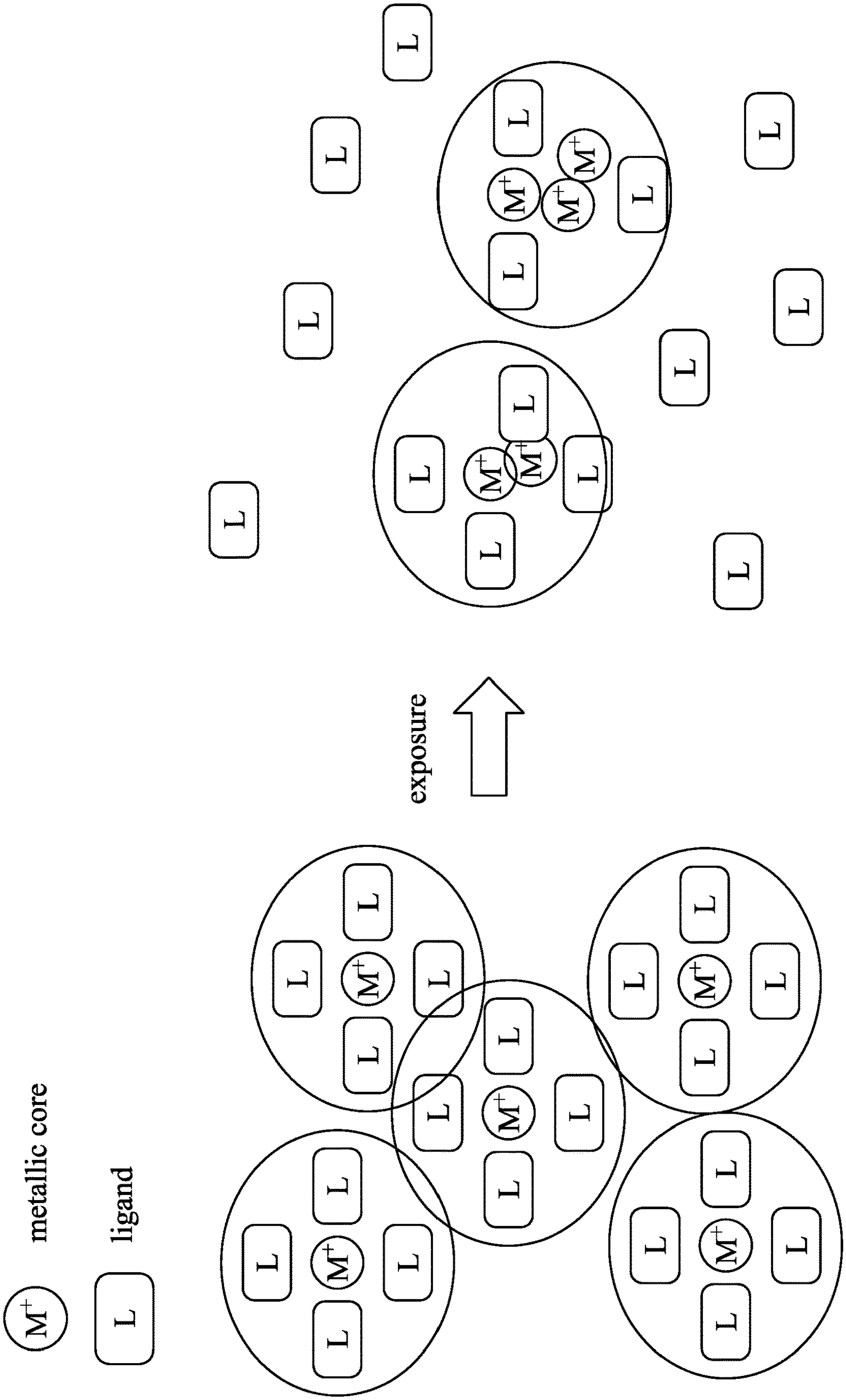
FIG. 14B shows a reaction the organometallic precursors undergo when exposed to actinic radiation.

In some embodiments, the first organometallic compound or first organometallic precursor includes a metallic core $M^+$ with ligands L attached to the metallic core $M^+$, as shown in FIG. 14B. In some embodiments, the metallic core $M^+$ is a metal oxide. The ligands L include $C_3$-$C_{12}$ aliphatic or aromatic groups in some embodiments. The aliphatic or aromatic groups may be unbranched or branched with cyclic, or noncyclic saturated pendant groups containing 1-9 carbons, including alkyl groups, alkenyl groups, and phenyl groups. The branched groups may be further substituted with oxygen or halogen. In some embodiments, the $C_3$-$C_{12}$ aliphatic or aromatic groups include heterocyclic groups. In some embodiments, the $C_3$-$C_{12}$ aliphatic or aromatic groups are attached to the metal by an ether or ester linkage. In some embodiments, the $C_3$-$C_{12}$ aliphatic or aromatic groups include nitrite and sulfonate substituents.

In some embodiments, the organometallic precursor or organometallic compound include a sec-hexyl tris(dimethylamino) tin, t-hexyl tris(dimethylamino) tin, i-hexyl tris (dimethylamino) tin, n-hexyl tris(dimethylamino) tin, sec-pentyl tris(dimethylamino) tin, t-pentyl tris(dimethylamino) tin, i-pentyl tris(dimethylamino) tin, n-pentyl tris(dimethylamino) tin, sec-butyl tris(dimethylamino) tin, t-butyl tris (dimethylamino) tin, i-butyl tris(dimethylamino) tin, n-butyl tris(dimethylamino) tin, sec-butyl tris(dimethylamino) tin, i-propyl tris(dimethylamino) tin, n-propyl tris(diethylamino) tin, and analogous alkyl(tris)(t-butoxy) tin compounds, including sec-hexyl tris(t-butoxy) tin, t-hexyl tris(t-butoxy) tin, i-hexyl tris(t-butoxy) tin, n-hexyl tris(t-butoxy) tin, sec-pentyl tris(t-butoxy) tin, t-pentyl tris(t-butoxy) tin, i-pentyl tris(t-butoxy) tin, n-pentyl tris(t-butoxy) tin, t-butyl tris(t-butoxy) tin, i-butyl tris(butoxy) tin, n-butyl tris(butoxy) tin, sec-butyl tris(butoxy) tin, i-propyl tris(butoxy) tin, or n-propyl tris(butoxy) tin. In some embodiments, the organometallic precursors or organometallic compounds are fluorinated. In some embodiments, the organometallic precursors or compounds have a boiling point less than about 200° C.

In some embodiments, the first compound or first precursor includes one or more unsaturated bonds that can be coordinated with a functional group, such as a hydroxyl group, on the surface of the substrate or an intervening underlayer to improve adhesion of the photoresist layer to the substrate or underlayer.

In some embodiments, the second precursor or second compound is at least one of an amine, a borane, a phosphine, or water. In some embodiments, the amine has a formula $N_pH_nX_m$, where $0 \leq n \leq 3$, $0 \leq m \leq 3$, $n+m=3$ when p is 1, and n+m=4 when p is 2, and each X is independently a halogen selected from the group consisting of F, Cl, Br, and I. In some embodiments, the borane has a formula $B_pH_nX_m$, where 0≤n≤3, 0≤m≤3, n+m=3 when p is 1, and n+m=4 when p is 2, and each X is independently a halogen selected from the group consisting of F, Cl, Br, and I. In some embodiments, the phosphine has a formula $P_pH_nX_m$, where 0≤n≤3, 0≤m≤3, n+m=3, when p is 1, or n+m=4 when p is 2, and each X is independently a halogen selected from the group consisting of F, Cl, Br, and I.

In some embodiments, a PBG is not applied to metallic photoresist compositions.

FIG. 14B shows metallic precursors undergoing a reaction as a result of exposure to actinic radiation in some embodiments. As a result of exposure to the actinic radiation, ligand groups L are split off from the metallic core $M^+$ of the metallic precursors, and two or more metallic precursor cores bond with each other.

Figure 14C:
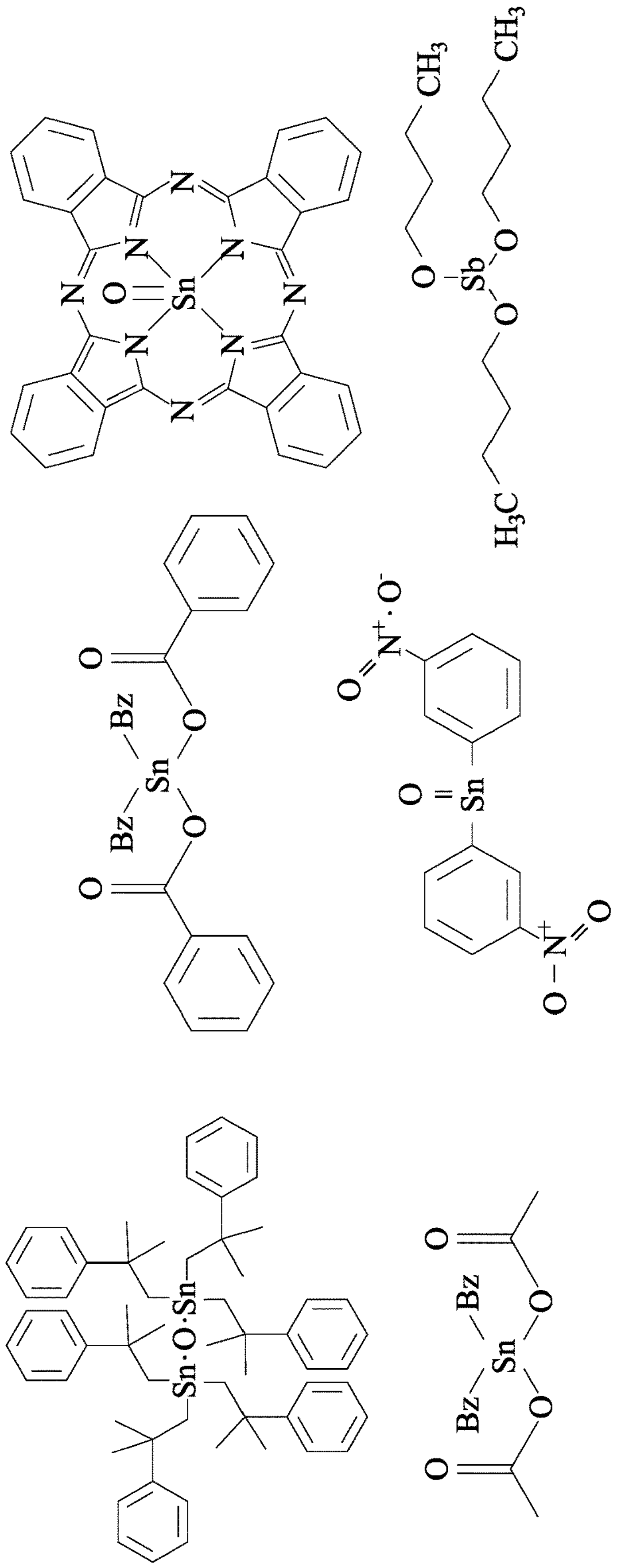
FIG. 14C shows examples of organometallic precursors according to embodiments of the disclosure.

FIG. 14C shows examples of organometallic precursors according to embodiments of the disclosure. In FIG. 14C, Bz is a benzene group.

In some embodiments, the operation S115 of forming a photoresist layer is performed by a vapor phase deposition operation. In some embodiments, the vapor phase deposition operation includes atomic layer deposition (ALD) and chemical vapor deposition (CVD). In some embodiments, the ALD includes plasma-enhanced atomic layer deposition (PE-ALD); the CVD includes plasma-enhanced chemical vapor deposition (PE-CVD), metal-organic chemical vapor deposition (MO-CVD), atmospheric pressure chemical vapor deposition (AP-CVD), and low pressure chemical vapor deposition (LP-CVD).

Figure 15:
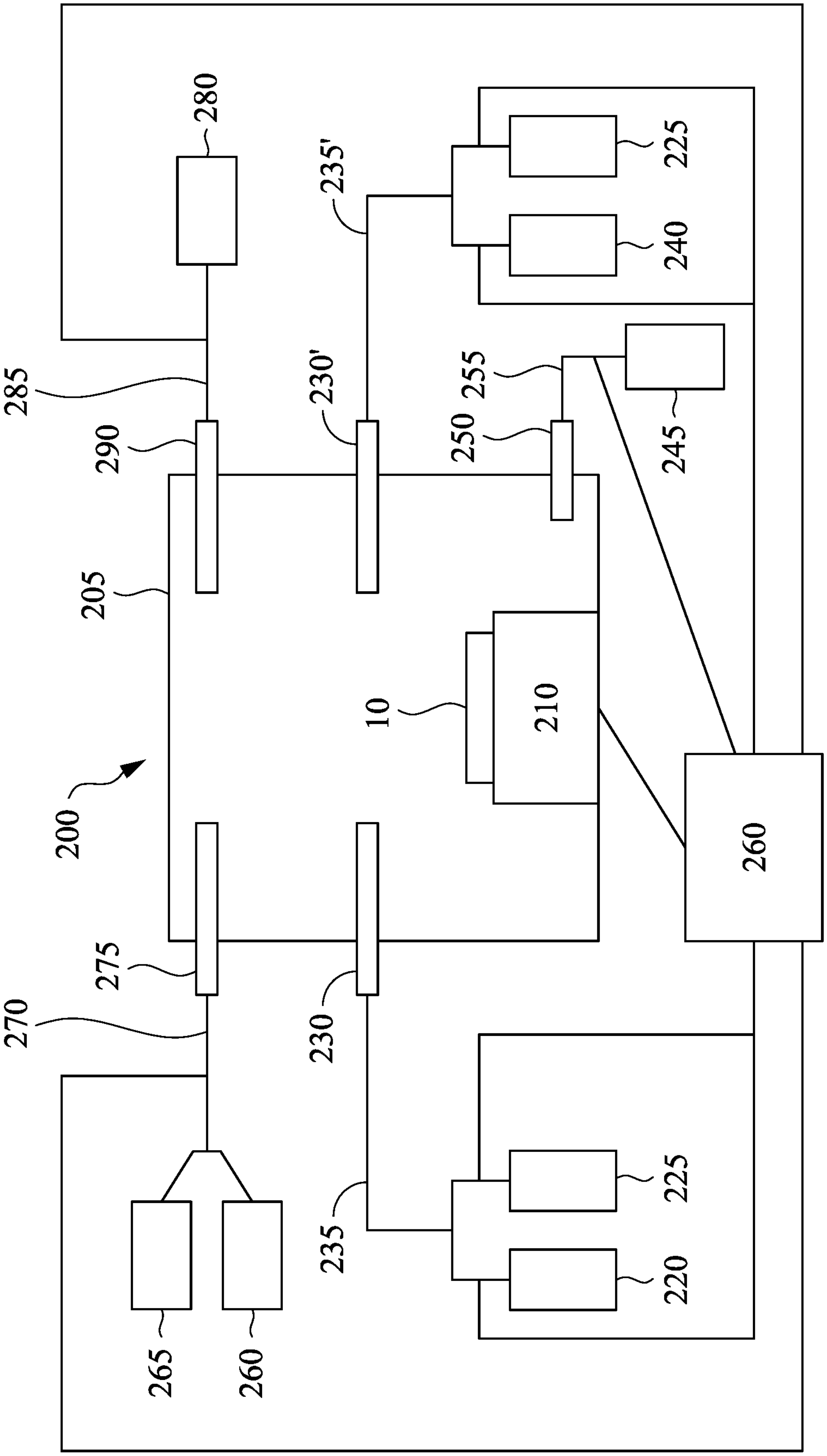
FIG. 15 illustrates a deposition apparatus according to embodiments of the disclosure.

A resist layer deposition apparatus 200 according to some embodiments of the disclosure is shown in FIG. 15. In some embodiments, the deposition apparatus 200 is an ALD or CVD apparatus. The deposition apparatus 200 includes a vacuum chamber 205. A substrate support stage 210 in the vacuum chamber 205 supports a substrate 10, such as silicon wafer. In some embodiments, the substrate support stage 210 includes a heater or a chiller. A first precursor or compound gas supply 220 and carrier/purge gas supply 225 are connected to an inlet 230 in the chamber via a gas line 235, and a second precursor or compound gas supply 240 and carrier/purge gas supply 225 are connected to another inlet 230' in the chamber via another gas line 235' in some embodiments. The chamber is evacuated, and excess reactants and reaction byproducts are removed by a vacuum pump 245 via an outlet 250 and exhaust line 255. In some embodiments, the flow rate or pulses of precursor gases and carrier/purge gases, evacuation of excess reactants and reaction byproducts, pressure inside the vacuum chamber 205, and temperature of the vacuum chamber 205 or wafer support stage 210 are controlled by a controller 260 configured to control each of these parameters.

Depositing a photoresist layer includes combining the first compound or first precursor and the second compound or second precursor in a vapor state to form the photoresist composition in some embodiments. In some embodiments, the first compound or first precursor and the second compound or second precursor of the photoresist composition are introduced into the deposition chamber 205 (CVD chamber) at about the same time via the inlets 230, 230'. In some embodiments, the first compound or first precursor and second compound or second precursor are introduced into the deposition chamber 205 (ALD chamber) in an alternating manner via the inlets 230, 230', i.e.—first one compound or precursor then a second compound or precursor, and then subsequently alternately repeating the introduction of the one compound or precursor followed by the second compound or precursor.

In some embodiments, the deposition chamber 205 temperature ranges from about 30° C. to about 400° C. during the deposition operation, and between about 50° C. to about 250° C. in other embodiments. In some embodiments, the pressure in the deposition chamber 205 ranges from about 5 mTorr to about 100 Torr during the deposition operation, and between about 100 mTorr to about 10 Torr in other embodiments. In some embodiments, the plasma power is less than about 1000 W. In some embodiments, the plasma power ranges from about 100 W to about 900 W. In some embodiments, the flow rate of the first compound or precursor and the second compound or precursor ranges from about 100 sccm to about 1000 sccm. In some embodiments, the ratio of the flow of the organometallic compound precursor to the second compound or precursor ranges from about 1:1 to about 1:5. At operating parameters outside the above-recited ranges, unsatisfactory photoresist layers result in some embodiments. In some embodiments, the photoresist layer formation occurs in a single chamber (a one-pot layer formation).

In a CVD process according to some embodiments of the disclosure, two or more gas streams, in separate inlet paths 230, 235 and 230', 235', of an organometallic precursor and a second precursor are introduced to the deposition chamber 205 of a CVD apparatus, where they mix and react in the gas phase, to form a reaction product. The streams are introduced using separate injection inlets 230, 230' or a dual-plenum showerhead in some embodiments. The deposition apparatus is configured so that the streams of organometallic precursor and second precursor are mixed in the chamber, allowing the organometallic precursor and second precursor to react to form a reaction product. Without limiting the mechanism, function, or utility of the disclosure, it is believed that the product from the vapor-phase reaction becomes heavier in molecular weight, and is then condensed or otherwise deposited onto the substrate 10.

In some embodiments, an ALD process is used to deposit the photoresist layer. During ALD, a layer is grown on a substrate 10 by exposing the surface of the substrate to alternate gaseous compounds (or precursors). In contrast to CVD, the precursors are introduced as a series of sequential, non-overlapping pulses. In each of these pulses, the precursor molecules react with the surface in a self-limiting way, so that the reaction terminates once all the reactive sites on the surface are consumed. Consequently, the maximum amount of material deposited on the surface after a single exposure to all of the precursors (a so-called ALD cycle) is determined by the nature of the precursor-surface interaction.

In an embodiment of an ALD process, an organometallic precursor is pulsed to deliver the metal-containing precursor to the substrate 10 surface in a first half reaction. In some embodiments, the organometallic precursor reacts with a suitable underlying species (for example OH or NH functionality on the surface of the substrate) to form a new self-saturating surface. Excess unused reactants and the reaction by-products are removed, by an evacuation-pump down using a vacuum pump 245 and/or by a flowing an inert purge gas in some embodiments. Then, a second precursor, such as ammonia ($NH_3$), is pulsed to the deposition chamber in some embodiments. The $NH_3$ reacts with the organometallic precursor on the substrate to obtain a reaction product photoresist on the substrate surface. The second precursor also forms self-saturating bonds with the underlying reactive species to provide another self-limiting and saturating second half reaction. A second purge is performed to remove unused reactants and the reaction by-products in some embodiments. Pulses of the first precursor and second precursor are alternated with intervening purge operations until a desired thickness of the photoresist layer is achieved.

In some embodiments, the first and second compounds or precursors are delivered into the deposition chamber 205 with a carrier gas. The carrier gas, a purge gas, a deposition gas, or other process gas may contain nitrogen, hydrogen, argon, neon, helium, or combinations thereof.

In some embodiments, the photoresist layer 15 is formed to a thickness of about 5 nm to about 50 nm, and to a thickness of about 10 nm to about 30 nm in other embodiments. A person of ordinary skill in the art will recognize that additional ranges of thicknesses within the explicit ranges above are contemplated and are within the present disclosure. The thickness can be evaluated using non-contact methods of x-ray reflectivity and/or ellipsometry based on the optical properties of the photoresist layers. In some embodiments, each photoresist layer thickness is relatively uniform to facilitate processing. In some embodiments, the variation in thickness of the deposited photoresist layer varies by no more than ±25% from the average thickness, in other embodiments each photoresist layer thickness varies by no more than ±10% from the average photoresist layer thickness. In some embodiments, such as high uniformity depositions on larger substrates, the evaluation of the photoresist layer uniformity may be evaluated with a 1 centimeter edge exclusion, i.e., the layer uniformity is not evaluated for portions of the coating within 1 centimeter of the edge. A person of ordinary skill in the art will recognize that additional ranges within the explicit ranges above are contemplated and are within the present disclosure.

In some embodiments, the organometallic compound includes tin (Sn), antimony (Sb), bismuth (Bi), indium (In), and/or tellurium (Te) as the metal component, however, the disclosure is not limited to these metals. In other embodiments, additional suitable metals include titanium (Ti), zirconium (Zr), hafnium (Hf), vanadium (V), cobalt (Co), molybdenum (Mo), tungsten (W), aluminum (Al), gallium (Ga), silicon (Si), germanium (Ge), phosphorus (P), arsenic (As), yttrium (Y), lanthanum (La), cerium (Ce), lutetium (Lu), or combinations thereof. The additional metals can be as alternatives to or in addition to the Sn, Sb, Bi, In, and/or Te.

The particular metal used may significantly influence the absorption of radiation. Therefore, the metal component can be selected based on the desired radiation and absorption cross section. Tin, antimony, bismuth, tellurium, and indium provide strong absorption of extreme ultraviolet light at 13.5 nm. Hafnium provides good absorption of electron beam and extreme UV radiation. Metal compositions including titanium, vanadium, molybdenum, or tungsten have strong absorption at longer wavelengths, to provide, for example, sensitivity to 248 nm wavelength ultraviolet light.

In some embodiments, the resist layer 15 is formed by mixing the organometallic compound in a solvent to form a resist composition and dispensing the resist composition onto the substrate 10. To aid in the mixing and dispensing of the photoresist, the solvent is chosen at least in part based upon the materials chosen for the metallic resist. In some embodiments, the solvent is chosen such that the organometallic is evenly dissolved into the solvent and dispensed upon the layer to be patterned.

In some embodiments, the resist solvent is an organic solvent, and includes any suitable solvent such as propylene glycol methyl ether acetate (PGMEA), propylene glycol monomethyl ether (PGME), 1-ethoxy-2-propanol (PGEE), γ-butyrolactone (GBL), cyclohexanone (CHN), ethyl lactate (EL), methanol, ethanol, propanol, n-butanol, acetone, dimethylformamide (DMF), isopropanol (IPA), tetrahydrofuran (THF), methyl isobutyl carbinol (MIBC), n-butyl acetate (nBA), 2-heptanone (MAK), formic acid, acetic acid, propanoic acid, butanoic acid, or the like.

As one of ordinary skill in the art will recognize, the materials listed and described above as examples of materials that may be used for the solvent component of the photoresist are merely illustrative and are not intended to limit the embodiments. Rather, any suitable material that dissolves the metallic photoresist material may be used to help mix and apply the photoresist. All such materials are fully intended to be included within the scope of the embodiments.

The resist layer deposition apparatus 200 illustrated in FIG. 15 is also used to apply the base composition 325 to the photoresist layer 15 in some embodiments. A base composition supply 260 and carrier gas supply 265 are connected to an inlet 275 in the chamber via a supply line 270. In some embodiments, the inlet 275 is configured to deliver the base composition 325 as a liquid spray or as an atomized vapor. In some embodiments, the base composition 325 is a gas. In some embodiments, a purge gas supply 280 is connected a purge gas inlet 290 via a gas supply line 285. In some embodiments, the chamber 205 is purged with the purge gas before the base composition 325 is introduced into the chamber 205. In some embodiments, the base composition 325 is introduced into the chamber 205 after the photoresist layer 15 is formed. In other embodiments, the base composition 325 is introduced into the chamber 205 substantially simultaneously with the introduction of the photoresist components, and the base composition is applied directly to the photoresist layer 15 while the photoresist layer 15 is being formed. In some embodiments, the flow rate the base composition, carrier gas, or purge gas are also controlled by the controller 260 configured to control each of these parameters, along with the flow rate of the precursor gases and carrier/purge gases, evacuation of excess reactants and reaction byproducts, pressure inside the vacuum chamber 205, and temperature of the vacuum chamber 205 or wafer support stage 210.

The base composition 325 and photoresist composition are applied onto the substrate 10 to form the base composition treated photoresist layer 15, as shown in FIGS. 2, 3A, 3B, 3C, and 4 in some embodiments. In some embodiments, the base composition 325 and the photoresist composition are applied using a process such as a spin-on coating process, a dip coating method, an air-knife coating method, a curtain coating method, a wire-bar coating method, a gravure coating method, a lamination method, an extrusion coating method, CVD, ALD, PVD, combinations of these, or the like. In some embodiments, the photoresist layer 15 thickness ranges from about 10 nm to about 300 nm.

After the photoresist layer 15 has been formed on the substrate 10 pre-exposure baking and cooling operations S140 are performed as necessary, as discussed herein (see FIGS. 1 and 4), and the photoresist layer 15 is selectively exposed to form an exposed region 50 and an unexposed region 52, as discussed herein, and shown in FIGS. 1, 5A and 5B. In some embodiments, the exposure to radiation is carried out by placing the photoresist coated substrate in a photolithography tool. The photolithography tool includes a photomask 30, 65 optics, an exposure radiation source to provide the radiation 45, 97 for exposure, and a movable stage for supporting and moving the substrate under the exposure radiation.

The selectively exposed doped photoresist layer 15 is subsequently post exposure baked/cooled and then developed, as shown in FIGS. 6 and 7. In some embodiments of the disclosure, the developer composition, includes: a first solvent having Hansen solubility parameters of $18>\delta_d>3$, $7>\delta_p>1$, and $7>\delta_h>1$; an organic acid having an acid dissociation constant, pKa, of $-11<pKa<4$; and a Lewis acid, wherein the organic acid and the Lewis acid are different. In some embodiments, the developer includes a base having a $pK_a$ of $40>pK_a>9.5$.

The units of the Hansen solubility parameters are $(Joules/cm^3)^{1/2}$ or, equivalently, $MPa^{1/2}$ and are based on the idea that one molecule is defined as being like another if it bonds to itself in a similar way. $\delta_d$ is the energy from dispersion forces between molecules. $\delta_p$ is the energy from dipolar intermolecular force between the molecules. $\delta_h$ is the energy from hydrogen bonds between molecules. The three parameters, $\delta_d$, $\delta_p$, and $\delta_h$, can be considered as coordinates for a point in three dimensions, known as the Hansen space. The nearer two molecules are in Hansen space, the more likely they are to dissolve into each other.

In some embodiments, the concentration of the first solvent ranges from about 60 wt. % to about 99 wt. % based on a total weight of the developer composition. In some embodiments, the concentration of the first solvent is greater than 60 wt. %. In other embodiments, the concentration of the first solvent ranges from about 70 wt. % to about 90 wt. % based on a total weight of the developer composition. In some embodiments, the first solvent is one or more of n-butyl acetate, methyl n-amyl ketone, hexane, heptane, and amyl acetate.

In some embodiments, the organic acid is one or more of ethanedioic acid, methanoic acid, 2-hydroxypropanoic acid, 2-hydroxybutanedioic acid, citric acid, uric acid, trifluoromethanesulfonic acid, benzenesulfonic acid, ethanesulfonic acid, methanesulfonic acid, and maleic acid. In some embodiments, the concentration of the organic acid is about 0.001 wt. % to about 30 wt. % based on a total weight of the developer composition.

In some embodiments, suitable bases for the photoresist developer composition 57 include an alkanolamine, a triazole, or an ammonium compound. In some embodiments, suitable bases include an organic base selected from the group consisting of monoethanolamine, monoisopropanolamine, 2-amino-2-methyl-1-propanol, 1H-benzotriazole, 1,2,4-triazole, 1,8-diazabicycloundec-7-ene, tetramethylammonium hydroxide, tetraethylammonium hydroxide, tetrapropylammonium hydroxide, and tetrabutylammonium hydroxide, and combinations thereof; or inorganic bases selected from the group consisting of ammonium hydroxide, ammonium sulfamate, ammonium carbamate, NaOH, KOH, LiOH, $Ca(OH)_2$, $Ba(OH)_2$, $Na_2CO_3$, $NH_4OH$, $Mg(OH)_2$, RbOH, CsOH, $Sr(OH)_2$ and combinations thereof or inorganic bases selected from the group consisting of ammonia, ammonium hydroxide, ammonium sulfamate, ammonium carbamate, and combinations thereof. In some embodiments, the concentration of the base is about 1 ppm to about 30 wt. % based on a total weight of the developer composition.

In some embodiments, the concentration of the Lewis acid is about 0.1 wt. % to about 15 wt. % based on a total weight of the developer composition, and in other embodiments, the concentration of the Lewis acid is about 1 wt. % to about 5 wt. % based on a total weight of the developer composition.

In some embodiments, the developer composition includes a second solvent having Hansen solubility parameters of $25>\delta_d>13$, $25>\delta_p>3$, and $30>\delta_h>4$, and the first solvent and the second solvent are different solvents. In some embodiments, the concentration of the second solvent ranges from about 0.1 wt. % to less than about 40 wt. % based on a total weight of the developer composition. In some embodiments, the second solvent is one or more of propylene glycol methyl ether, propylene glycol ethyl ether, γ-butyrolactone, cyclohexanone, ethyl lactate, methanol, ethanol, propanol, n-butanol, acetone, dimethyl formamide, acetonitrile, isopropanol, tetrahydrofuran, or acetic acid.

In some embodiments, the developer composition includes about 0.001 wt. % to about 30 wt. % of a chelate based on the total weight of the developer composition. In other embodiments, the developer composition includes about 0.1 wt. % to about 20 wt. % of the chelate based on the total weight of the developer composition. In some embodiments, the chelate is one or more of ethylenediaminetetraacetic acid (EDTA), ethylenediamine-N,N'-disuccinic acid (EDDS), diethylenetriaminepentaacetic acid (DTPA), polyaspartic acid, trans-1,2-cyclohexanediamine-N,N,N',N'-tetraacetic acid monohydrate, ethylenediamine, or the like.

In some embodiments, the developer composition includes water or ethylene glycol at a concentration of about 0.001 wt. % to about 30 wt. % based on a total weight of the developer composition.

In some embodiments, the photoresist developer composition includes a surfactant in a concentration range of from about 0.001 wt. % to about less than 5 wt. % based on a total weight of the developer composition to increase the solubility and reduce the surface tension on the substrate. In other embodiments, the concentration of the surfactant ranges from about 0.01 wt. % to about 1 wt. % based on the total weight of the developer composition.

At concentrations of the developer composition components outside the disclosed ranges, developer composition performance and development efficiency may be reduced, leading to increased photoresist residue and scum in the photoresist pattern, and increased line width roughness and line edge roughness.

In some embodiments, the developer 57 is applied to the photoresist layer 15 using a spin-on process. In the spin-on process, the developer 57 is applied to the photoresist layer 15 from above the photoresist layer 15 while the photoresist coated substrate is rotated, as shown in FIG. 7. In some embodiments, the developer 57 is supplied at a rate of between about 5 ml/min and about 800 ml/min, while the photoresist coated substrate 10 is rotated at a speed of between about 100 rpm and about 2000 rpm. In some embodiments, the developer is at a temperature of between about 20° C. and about 75° C. during the development operation. The development operation continues for between about 10 seconds to about 10 minutes in some embodiments.

While the spin-on operation is one suitable method for developing the photoresist layer 15 after exposure, it is intended to be illustrative and is not intended to limit the embodiment. Rather, any suitable development operations, including dip processes, puddle processes, and spray-on methods, may alternatively be used. All such development operations are included within the scope of the embodiments.

During the development process, the developer composition 57 dissolves the photoresist regions 52 not exposed to radiation, exposing the surface of the substrate 10, as shown in FIG. 8, and leaving behind well-defined exposed photoresist regions 50, having improved definition than provided by conventional negative tone photoresist photolithography.

After the developing operation S170, remaining developer is removed from the patterned photoresist covered substrate. The remaining developer is removed using a spin-dry process in some embodiments, although any suitable removal technique may be used. After the photoresist layer 15 is developed, and the remaining developer is removed, additional processing is performed while the patterned photoresist layer 50 is in place. For example, an etching operation, using dry or wet etching, is performed in some embodiments, to transfer the pattern of the photoresist layer 50 to the underlying substrate 10, forming recesses 55' as shown in FIG. 9. The substrate 10 has a different etch resistance than the photoresist layer 15. In some embodiments, the etchant is more selective to the substrate 10 than the photoresist layer 15.

Figure 16B:
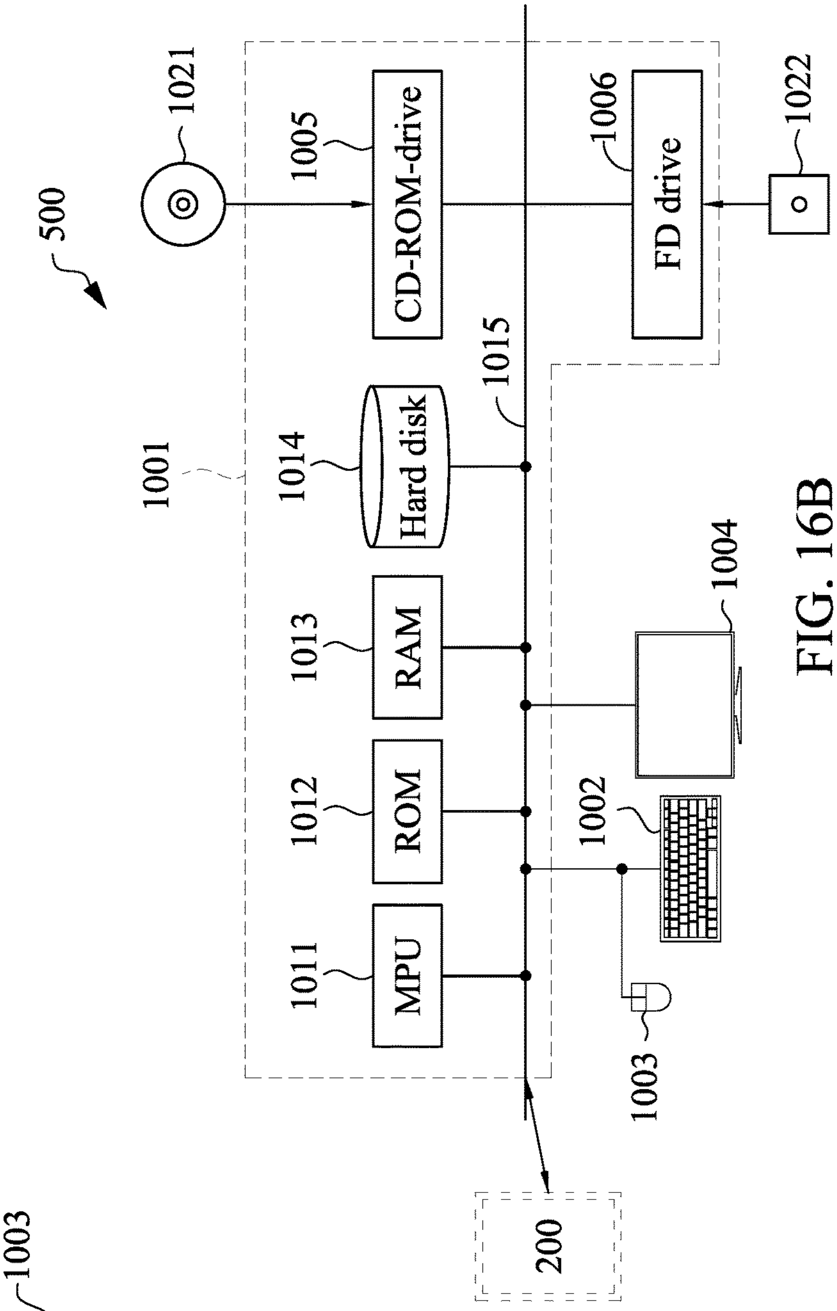
FIG. 16A and FIG. 16B are diagrams of a controller according to some embodiments of the disclosure.
Figure 16A:
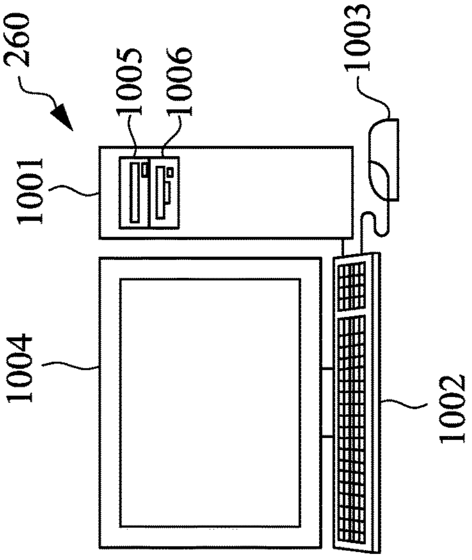
Figure 17:
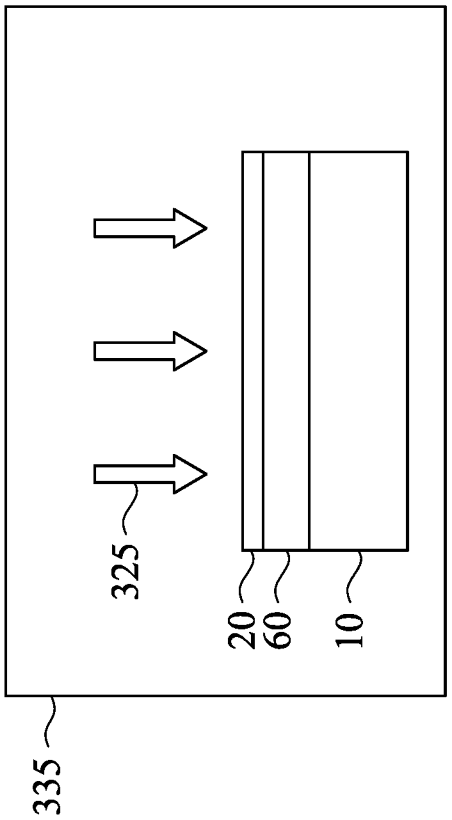
FIG. 17 shows a process stage of a sequential operation according to embodiments of the disclosure.

In some embodiments, the controller 260 is a computer system. FIG. 16A and FIG. 16B illustrate a computer system 260 for controlling a deposition apparatus 200 its components in accordance with various embodiments of the disclosure. FIG. 16A is a schematic view of the computer system 260 that controls the deposition apparatus 200 and its components. In some embodiments, the computer system 260 is programmed to monitor and control the flow rate of the precursor gases and carrier/purge gases, evacuation of excess reactants and reaction byproducts, pressure inside the vacuum chamber 205, temperature of the vacuum chamber 205 or wafer support stage 210, and the flow rate of the base composition.

As shown in FIG. 16A, the computer system 260 is provided with a computer 1001 including an optical disk read only memory (e.g., CD-ROM or DVD-ROM) drive 1005 and a magnetic disk drive 1006, a keyboard 1002, a mouse 1003 (or other similar input device), and a monitor 1004 in some embodiments.

FIG. 16B is a diagram showing an internal configuration of the computer system 260. In FIG. 16B, the computer 1001 is provided with, in addition to the optical disk drive 1005 and the magnetic disk drive 1006, one or more processors 1011, such as a micro-processor unit (MP) or a central processing unit (CPU); a read-only memory (ROM) 1012 in which a program, such as a boot up program is stored; a random access memory (RAM) 1013 that is connected to the processors 1011 and in which a command of an application program is temporarily stored, and a temporary electronic storage area is provided; a hard disk 1014 in which an application program, an operating system program, and data are stored; and a data communication bus 1015 that connects the processors 1011, the ROM 1012, and the like. Note that the computer 1001 may include a network card (not shown) for providing a connection to a computer network such as a local area network (LAN), wide area network (WAN) or any other useful computer network for communicating data used by the computer system 260 and the deposition apparatus 200. In various embodiments, the controller 260 communicates via wireless or hardwired connection to the deposition apparatus 200 and its components.

The programs for causing the computer system 260 to execute the method for controlling the deposition apparatus 200 and its components are stored in an optical disk 1021 or a magnetic disk 1022, which is inserted into the optical disk drive 1005 or the magnetic disk drive 1006, and transmitted to the hard disk 1014. Alternatively, the programs are transmitted via a network (not shown) to the computer system 500 and stored in the hard disk 1014. At the time of execution, the programs are loaded into the RAM 1013. The programs are loaded from the optical disk 1021 or the magnetic disk 1022, or directly from a network in various embodiments.

The stored programs do not necessarily have to include, for example, an operating system (OS) or a third-party program to cause the computer 1001 to execute the methods disclosed herein. The program may only include a command portion to call an appropriate function (module) in a controlled mode and obtain desired results in some embodiments. In various embodiments described herein, the controller 260 is in communication with the deposition apparatus 200 to control various functions thereof.

The controller 260 is coupled to the deposition apparatus 200 including the pressure compensator in various embodiments. The controller 260 is configured to provide control data to those system components and receive process and/or status data from those system components. For example, in some embodiments, the controller 260 comprises a microprocessor, a memory (e.g., volatile or non-volatile memory), and a digital I/O port capable of generating control voltages sufficient to communicate and activate inputs to the processing system, as well as monitor outputs from the deposition apparatus 200. In addition, a program stored in the memory is utilized to control the aforementioned components of the deposition apparatus 200 according to a process recipe. Furthermore, the controller 260 is configured to analyze the process and/or status data, to compare the process and/or status data with target process and/or status data, and to use the comparison to change a process and/or control a system component. In addition, the controller 260 is configured to analyze the process and/or status data, to compare the process and/or status data with historical process and/or status data, and to use the comparison to predict, prevent, and/or declare a fault or alarm.

As set forth above, the executed program causes the processor or computer 260 to measure the pressure in the coolant or cooling fluid line or conduit, determine a pressure difference between the coolant or cooling fluid inflow line and outflow line, determine whether the pressure difference is greater than a threshold value, and adjust a valve to change the coolant or cooling fluid flowrate to reduce the pressure difference when the pressure difference is greater than the stored threshold value. In some embodiments, the executed program causes the processor or computer 500 to measure the pressure in the coolant or cooling fluid line or conduit periodically, for example, every second, 10 seconds, 20 seconds, or 30 seconds.

In some embodiments, a layer to be patterned (target layer) 60 is disposed over the substrate prior to forming the photoresist layer 15 or applying the base composition 325, as shown in FIGS. 17, 18A, 18B, and 18C. Pre-exposure baking/cooling operations S140 are performed, as necessary to dry and cure the photoresist layer 15, as shown in FIG. 19, and discussed herein in reference to FIGS. 1 and 4. In some embodiments, the target layer 60 is a metallization layer or a dielectric layer, such as a passivation layer, disposed over a metallization layer. In embodiments where the target layer 60 is a metallization layer, the target layer 60 is formed of a conductive material using metallization processes, and metal deposition techniques, including chemical vapor deposition, atomic layer deposition, and physical vapor deposition (sputtering). Likewise, if the target layer 60 is a dielectric layer, the target layer 60 is formed by dielectric layer formation techniques, including thermal oxidation, CVD, ALD, and PVD.

Figure 3A:
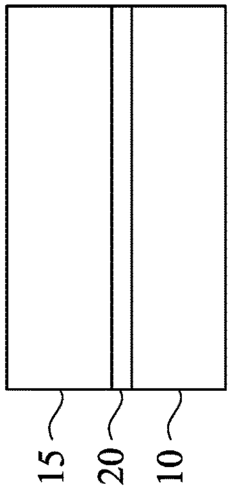
FIGS. 3A, 3B, and 3C show process stages of a sequential operation according to embodiments of the disclosure.
Figure 3B:
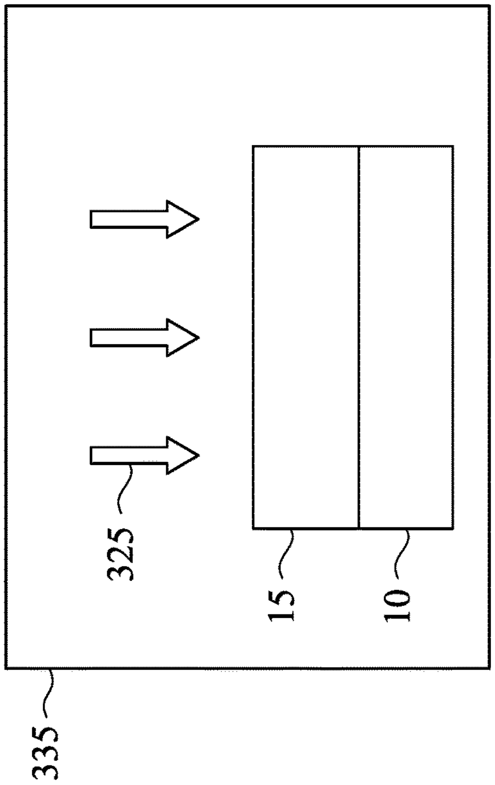
Figure 3C:
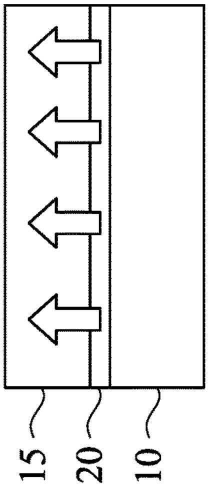
Figure 18B:
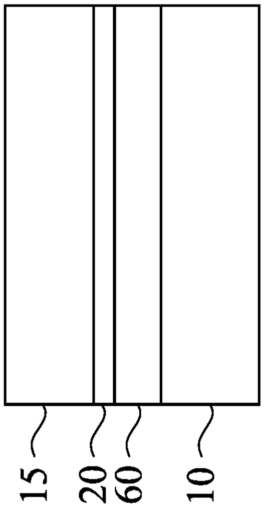
FIGS. 18A, 18B, and 18C show process stages of a sequential operation according to embodiments of the disclosure.
Figure 18C:
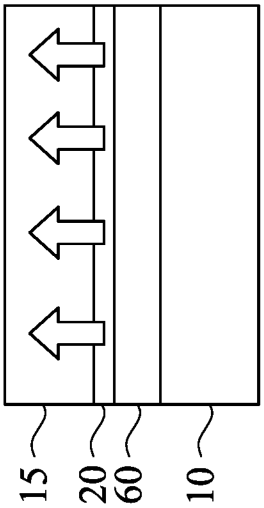
Figure 18A:
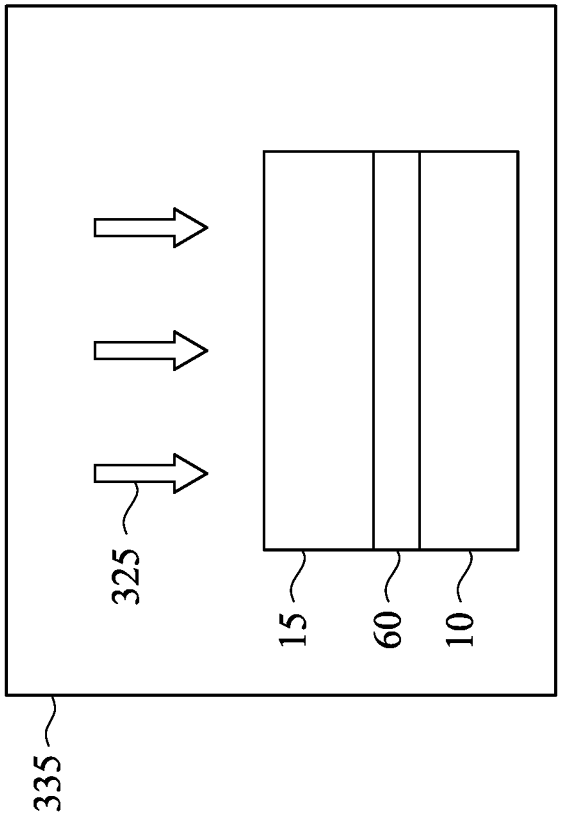
Figure 19:
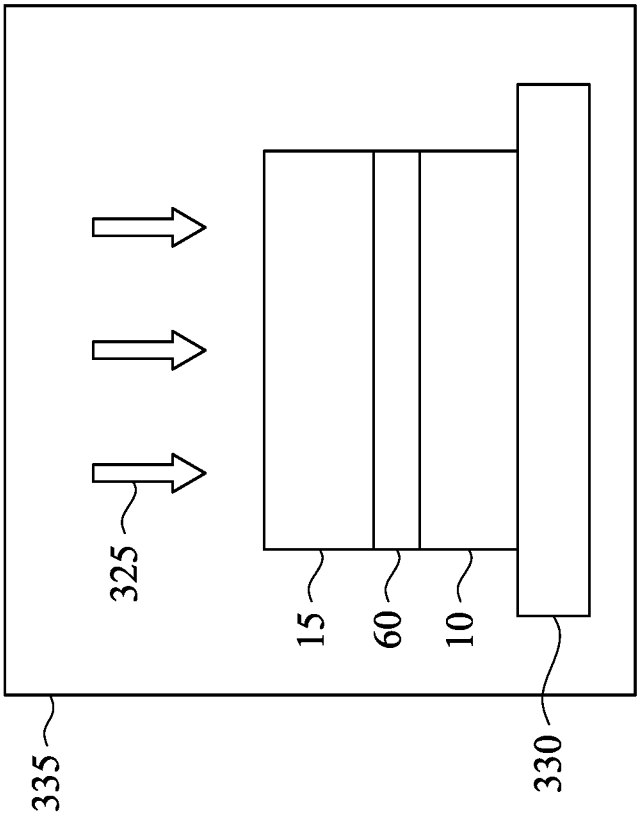
FIG. 19 shows a process stage of a sequential operation according to an embodiment of the disclosure.

The pre-exposure bake S140 could also be performed to apply the base composition into the photoresist layer 15, as shown in FIGS. 18A, 18C, and 19, and discussed herein in reference to FIGS. 3A, 3C, and 4.

Figure 20A:
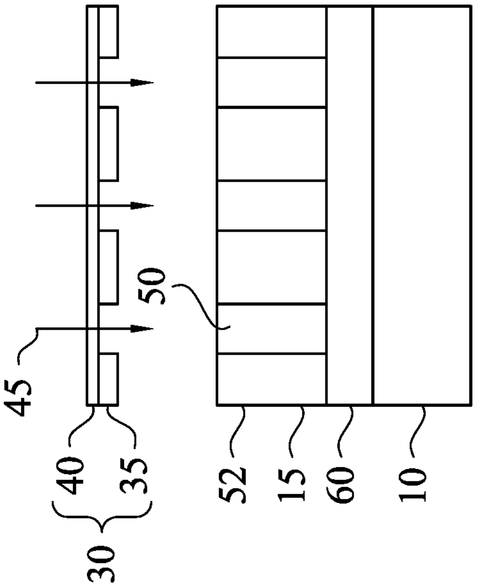
FIGS. 20A and 20B show process stages of a sequential operation according to embodiments of the disclosure.
Figure 20B:
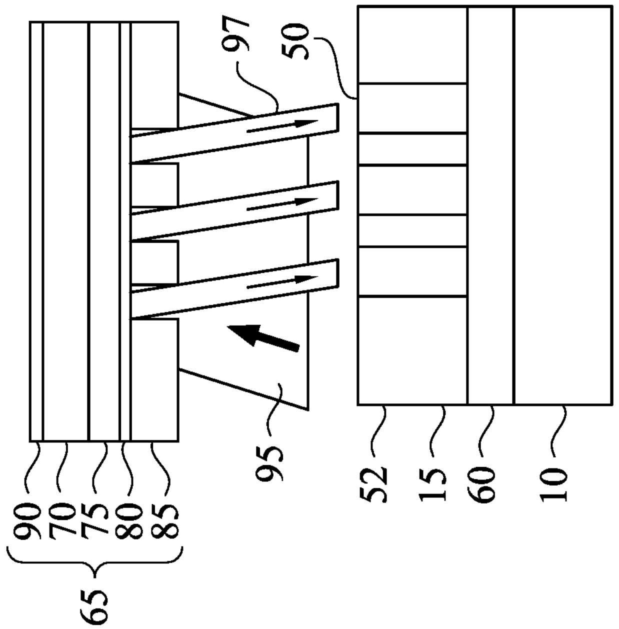

The photoresist layer 15 is subsequently selectively exposed to actinic radiation 45, 97 in operation S150 to form exposed regions 50 and unexposed regions 52 in the photoresist layer, as shown in FIGS. 20A and 20B, and described herein in relation to FIGS. 5A and 5B. As explained herein when the photoresist is a negative photoresist, crosslinking occurs in the exposed regions 50 in some embodiments.

Figure 21:
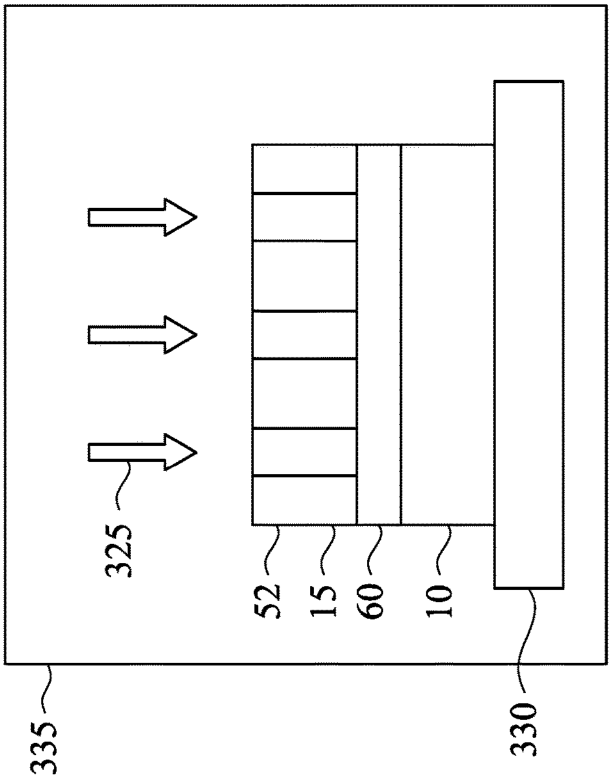
FIG. 21 shows a process stage of a sequential operation according to an embodiment of the disclosure.

As shown in FIG. 21, post exposure baking/cooling operations S160 are subsequently performed, and the base composition 325 is applied in some embodiments, as described herein in relation to FIG. 6.

Figure 22:
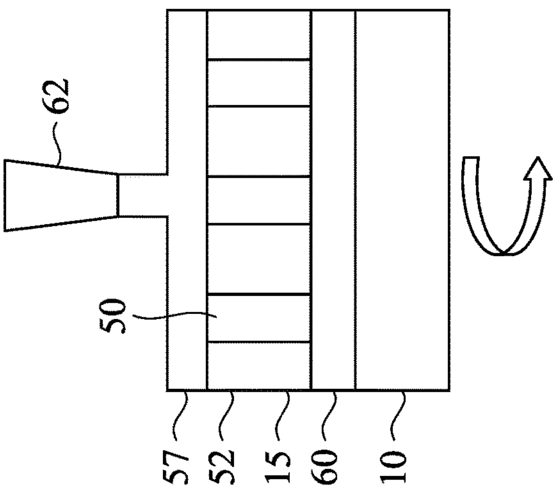
FIG. 22 shows a process stage of a sequential operation according to an embodiment of the disclosure.
Figure 23:
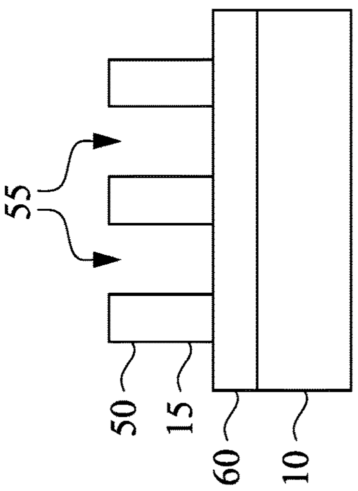
FIG. 23 shows a process stage of a sequential operation according to an embodiment of the disclosure.
Figure 24:
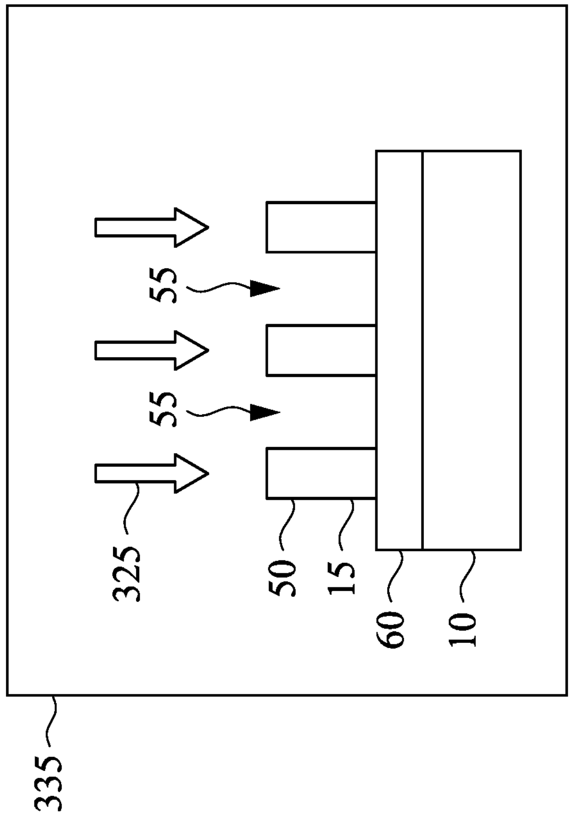
FIG. 24 shows a process stage of a sequential operation according to an embodiment of the disclosure.

As shown in FIG. 22, the selectively exposed photoresist layer 50, 52 is subsequently developed by dispensing developer 57 from a dispenser 62 in operation S170 to form a pattern of photoresist openings 55, as shown in FIG. 23. The development operation is similar to that explained with reference to FIGS. 7 and 8, herein. In some embodiments, the base composition 325 is applied to the developed photoresist pattern 50, as shown in FIG. 24, and as discussed herein in relation to FIG. 9.

Figure 25:
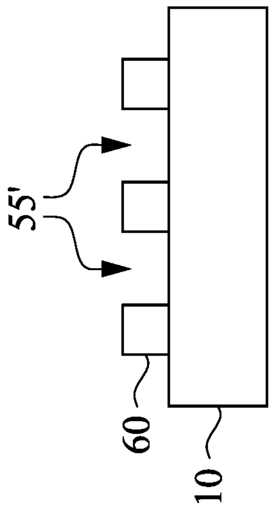
FIG. 25 shows a process stage of a sequential operation according to an embodiment of the disclosure.

Then as shown in FIG. 25, the pattern 55 in the photoresist layer 15 is transferred to the target layer 60 using an etching operation and the photoresist layer is removed, as explained with reference to FIG. 10 to form pattern 55' in the target layer 60.

Other embodiments include other operations before, during, or after the operations described above. In some embodiments, the disclosed methods include forming fin field effect transistor (FinFET) structures. In some embodiments, a plurality of active fins are formed on the semiconductor substrate. Such embodiments, further include etching the substrate through the openings of a patterned hard mask to form trenches in the substrate; filling the trenches with a dielectric material; performing a chemical mechanical polishing (CMP) process to form shallow trench isolation (STI) features; and epitaxy growing or recessing the STI features to form fin-like active regions. In some embodiments, one or more gate electrodes are formed on the substrate. Some embodiments include forming gate spacers, doped source/drain regions, contacts for gate/source/drain features, etc. In other embodiments, a target pattern is formed as metal lines in a multilayer interconnection structure. For example, the metal lines may be formed in an inter-layer dielectric (ILD) layer of the substrate, which has been etched to form a plurality of trenches. The trenches may be filled with a conductive material, such as a metal; and the conductive material may be polished using a process such as chemical mechanical planarization (CMP) to expose the patterned ILD layer, thereby forming the metal lines in the ILD layer. The above are non-limiting examples of devices/structures that can be made and/or improved using the method described herein.

In some embodiments, active components such diodes, field-effect transistors (FETs), metal-oxide semiconductor field effect transistors (MOSFET), complementary metal-oxide semiconductor (CMOS) transistors, bipolar transistors, high voltage transistors, high frequency transistors, FinFETs, gate all around FETs (GAA FETs), other three-dimensional (3D) FETs, other memory cells, and combinations thereof are formed, according to embodiments of the disclosure.

The novel base application techniques and semiconductor manufacturing methods according to the present disclosure provide higher semiconductor device feature density with reduced defects in a higher efficiency process than conventional methods. The novel techniques and methods improve the sensitivity of the photoresist greater than about 5% in some embodiments. In some embodiments, the sensitivity improvement is about 10% to about 40%. Thus, a corresponding reduction (i.e.-about 5% to about 40%) in exposure dose can be achieved. In some embodiments, the LWR improvement is greater than about 5%. In some embodiments, the LWR improvement is about 5% to about 40%. In some embodiments, the base treatment is applied at more than one or at all of the operations disclosed herein. In some embodiments, applying the base treatment at more than one operation improves the sensitivity or LWR-than a single application of the base treatment. In some embodiments, the techniques and methods disclosed herein provide improved critical dimension uniformity (CDU) than conventional manufacturing methods.

An embodiment of the disclosure is a method of manufacturing a semiconductor device including forming a photoresist layer over a substrate and applying a base composition to the photoresist layer, wherein the base composition includes a non-organic base, an organic base, a thermal base generator, or a photo base generator. The photoresist layer is selectively exposed to actinic radiation to form a latent pattern. The latent pattern is developed by applying a developer composition to the selectively exposed photoresist layer to form a pattern in the photoresist layer. The base composition is applied to the photoresist layer during one or more operations selected from the group consisting of applying the base composition to the substrate as an under-layer before the photoresist layer is formed and the base composition is subsequently absorbed by the photoresist layer, a pre-exposure baking operation, after the photoresist layer is selectively exposed and before the developing the latent pattern, and after the developing the latent pattern. In an embodiment, the photoresist layer is formed in a vacuum chamber and the base composition is applied to the photoresist layer in the vacuum chamber. In an embodiment, the base composition includes a photobase generator. In an embodiment, the base composition includes a thermal base generator. In an embodiment, the base composition is applied to the photoresist layer during a post exposure baking operation or a cooling operation after the post exposure baking operation. In an embodiment, the photoresist layer is formed of a metallic resist, a negative resist, or a negative tone developed resist. In an embodiment, the base composition is a vapor or a gas when applied to the photoresist layer.

Another embodiment of the disclosure is a method of manufacturing a semiconductor device, including forming a photoresist layer over a substrate and applying a base composition to the photoresist layer. The photoresist layer is selectively exposed to actinic radiation to form a latent pattern. The latent pattern is developed by applying a developer composition to the selectively exposed photoresist layer to form a pattern in the photoresist layer. The base composition is applied as a liquid or a vapor after the photoresist layer is formed and before the developing the latent pattern, or is applied as the liquid or vapor after the developing the latent pattern. In an embodiment, the base composition includes a photobase generator. In an embodiment, the base composition comprises a thermal base generator. In an embodiment, the base composition is applied to the photoresist layer during a post exposure baking operation or a cooling operation after the post exposure baking operation. In an embodiment, the photoresist layer is formed of a metallic resist, a negative resist, or a negative tone developed resist.

Another embodiment of the disclosure is a method of manufacturing a semiconductor device, including forming a photoresist layer over a substrate and applying a base composition to the photoresist layer. The photoresist layer is selectively exposed to actinic radiation to form a latent pattern. The latent pattern is developed by applying a developer composition to the selectively exposed photoresist layer to form a pattern in the photoresist layer. The base composition is applied in a gas phase after the photoresist layer is formed and before the developing the latent pattern, or is applied in the gas phase after the developing the latent pattern. In an embodiment, the base composition is applied to the photoresist layer during a pre-exposure baking operation or a cooling operation after the pre-exposure baking operation. In an embodiment, the base composition is applied to the photoresist layer after the exposing the photoresist layer to actinic radiation. In an embodiment, the base composition is applied to the photoresist layer during a post exposure baking operation or a cooling operation after the post exposure baking operation. In an embodiment, the photoresist layer is formed of a metallic resist, a negative resist, or a negative tone developed resist. In an embodiment, the base composition is applied in a vacuum chamber. In an embodiment, the photoresist layer is formed in a vacuum chamber. In an embodiment, the base composition is applied in the vacuum chamber.

Another embodiment of the disclosure is a method of manufacturing a semiconductor device, including forming a photoresist layer over a substrate. A base composition is applied to the photoresist layer in a vacuum chamber. The photoresist layer is selectively exposed to actinic radiation to form a latent pattern. The latent pattern is developed by applying a developer composition to the selectively exposed photoresist layer to form a pattern in the photoresist layer. In an embodiment, the base composition is mixed with a photoresist material during the forming the photoresist layer. In an embodiment, the base composition is formed as underlayer over the substrate before forming the photoresist layer. In an embodiment, the base composition is applied to the photoresist layer during a pre-exposure baking operation or a cooling operation after the pre-exposure baking operation. In an embodiment, the base composition is applied to the photoresist layer after the exposing the photoresist layer to actinic radiation. In an embodiment, the base composition is applied to the photoresist layer during a post exposure baking operation or a cooling operation after the post exposure baking operation. In an embodiment, the base composition is applied to the photoresist layer after developing the latent pattern. In an embodiment, the photoresist layer is formed in the vacuum chamber. In an embodiment, the photoresist layer is formed of a metallic resist, a negative resist, or a negative tone developed resist.

Another embodiment of the disclosure is a method of manufacturing a semiconductor device, including forming a photoresist layer over a substrate. A base composition is applied to the photoresist layer, wherein the base composition includes one or more selected from the group consisting of LiOH, $Ca(OH)_2$, $Ba(OH)_2$, $Na_2CO_3$, $Mg(OH)_2$, RbOH, CsOH, $Sr(OH)_2$, $C_3H_5O_2NH_2$, $CH_3O_2NH_2$, $NH_2—CH_2—NH_2$, $NH_2—C_2H_4—NH_2$, $(NH_2)_xR_x$, $(NH_2)_xO_2R_x$, $(NH_2)_xOR_x$, $NH_2CH_2OCH_2NH_2$,

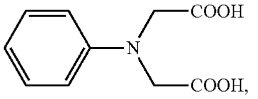

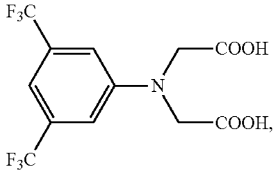

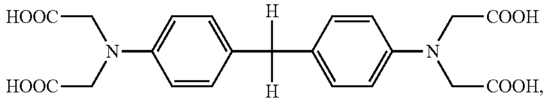

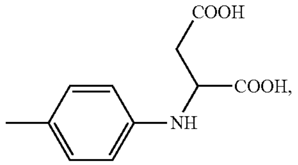

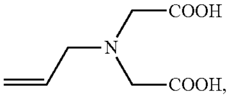

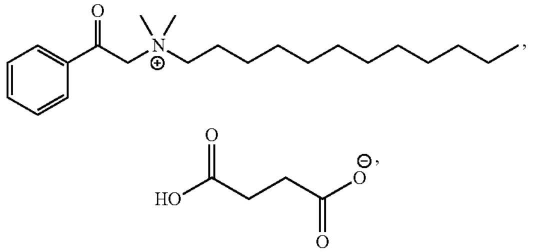

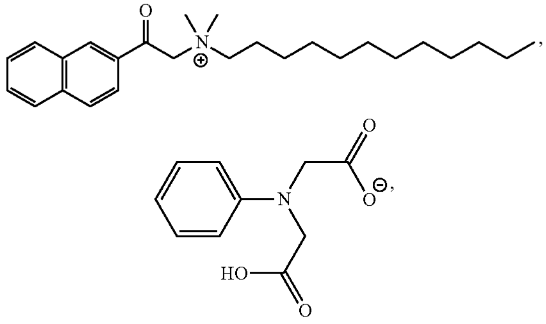

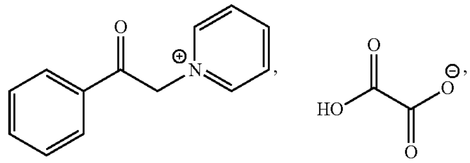

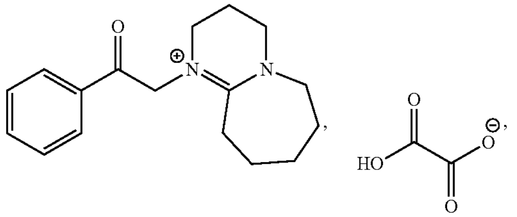

-continued

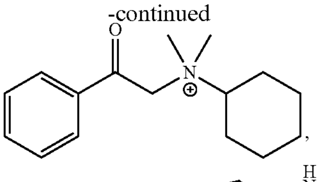

,

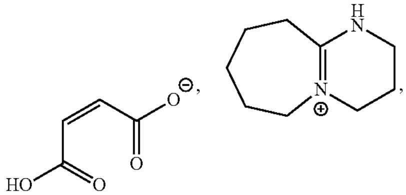

,

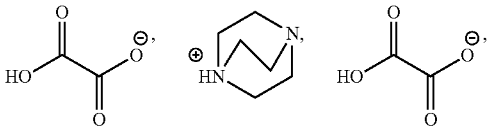

,

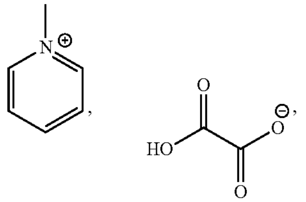

,

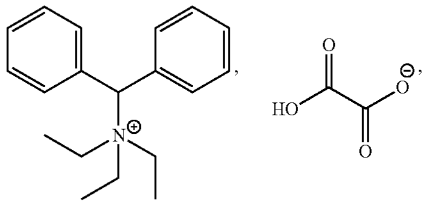

,

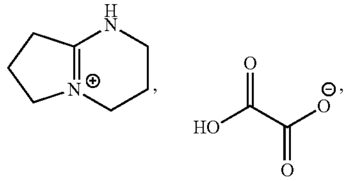

,

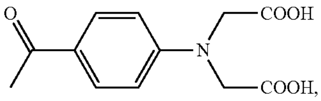

, and

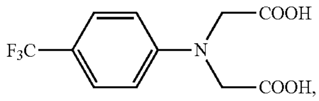

, wherein x=1-8, and R is a C1 to C8 hydrocarbon group. The photoresist layer is selectively exposed to actinic radiation to form a latent pattern. The latent pattern is developed by applying a developer composition to the selectively exposed photoresist layer to form a pattern in the photoresist layer. In an embodiment, the base composition is mixed with a photoresist material before forming the photoresist layer. In an embodiment, the base composition is formed as an underlayer over the substrate before forming the photoresist layer, and the base composition is subsequently absorbed by the photoresist layer after the photoresist layer is formed. In an embodiment, the base composition is applied to the photoresist layer during a pre-exposure baking operation or a cooling operation after the pre-exposure baking operation. In an embodiment, the base composition is applied to the photoresist layer during a post exposure baking operation or a cooling operation or after the post exposure baking operation. In an embodiment, the base composition is applied to the photoresist layer after the exposing the photoresist layer to actinic radiation. In an embodiment, the base composition is applied to the photoresist layer after developing the latent pattern. In an embodiment, the base composition is applied to the photoresist layer at two or more of mixing with a photoresist material before forming the photoresist layer, during a pre-exposure baking operation or a cooling operation after the pre-exposure baking operation, as an underlayer over the substrate before forming the photoresist layer, during a post exposure baking operation or a cooling operation, after the post exposure baking operation, after the exposing the photoresist layer to actinic radiation, and after developing the latent pattern.

Another embodiment of the disclosure is a method of manufacturing a semiconductor device, including forming a photoresist layer over a substrate, and selectively exposing the photoresist layer to actinic radiation to form a latent pattern. The latent pattern is developed by applying a developer composition to the selectively exposed photoresist layer to form a pattern in the photoresist layer. The developer composition includes one or more bases selected from the group consisting of LiOH, $Ca(OH)_2$, $Ba(OH)_2$, $Na_2CO_3$, $Mg(OH)_2$, RbOH, CsOH, $Sr(OH)_2$, primary alkyl amines, secondary alkyl amines, tertiary alkyl amines, alkyl diamines, cycloalkyl amines, anilines, pyridines, pyrrolidines, $C_3H_5O_2NH_2$, $CH_3O_2NH_2$, $NH_2—CH_2—NH_2$, $NH_2—C_2H_4—NH_2$, $(NH_2)_xR_x$, $(NH_2)_xO_2R_x$, $(NH_2)_xOR_x$, $NH_2CH_2OCH_2NH_2$,

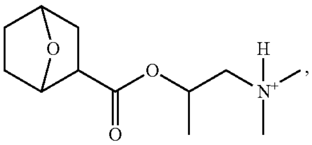

,

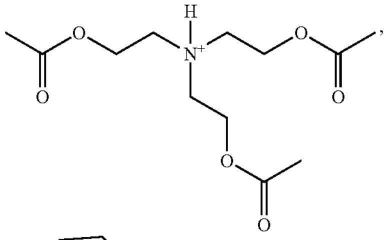

,

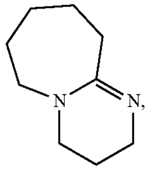

,

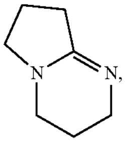

,

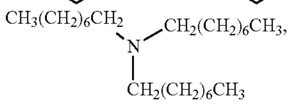

,

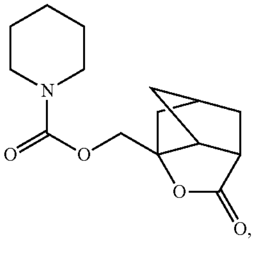

,

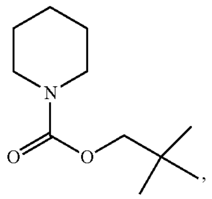

,

-continued

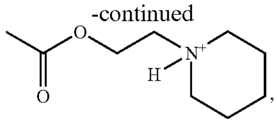

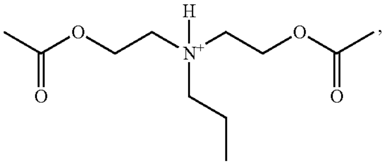

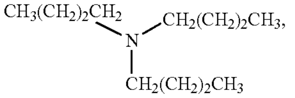

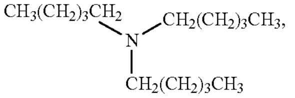

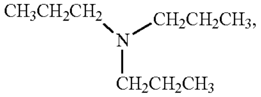

photobase generators, and thermal base generators, wherein x=1-8, and R is a C1 to C8 hydrocarbon group.

In an embodiment, the method includes adding a second base composition to a photoresist material used to form the photoresist layer. In an embodiment, the method includes applying a second base composition to the photoresist layer before the developing the latent pattern.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, comprising:

forming a photoresist layer over a substrate;

applying a base composition to the photoresist layer, wherein the base composition comprises a thermal base generator;

selectively exposing the photoresist layer to actinic radiation to form a latent pattern; and developing the latent pattern by applying a developer composition to the selectively exposed photoresist layer to form a pattern in the photoresist layer, wherein the base composition is applied to the photoresist layer during one or more operations selected from the group consisting of applying the base composition to the substrate as an underlayer before the photoresist layer is formed and the base composition is subsequently absorbed by the photoresist layer, a pre-exposure baking operation, after the photoresist layer is selectively exposed to actinic radiation and before the developing the latent pattern, and after the developing the latent pattern.

2. The method according to claim 1, wherein the photoresist layer is formed in a vacuum chamber and the base composition is applied to the photoresist layer in the vacuum chamber.

3. The method according to claim 1, wherein the base composition further comprises a photobase generator.

4. The method according to claim 1, wherein the base composition is applied to the photoresist layer during a post exposure baking operation or a cooling operation after the post exposure baking operation.

5. The method according to claim 1, wherein the photoresist layer is formed of a metallic resist, a negative resist, or a negative tone developed resist.

6. The method according to claim 1, wherein the base composition is a vapor or a gas when applied to the photoresist layer.

7. The method according to claim 1, wherein the base composition further comprises a non-organic base or an organic base.

8. A method of manufacturing a semiconductor device, comprising:

forming a photoresist layer over a substrate;

applying a base composition comprising a thermal base generator to the photoresist layer, selectively exposing the photoresist layer to actinic radiation to form a latent pattern; and developing the latent pattern by applying a developer composition to the selectively exposed photoresist layer to form a pattern in the photoresist layer, wherein the base composition is applied as a liquid or a vapor during a pre-exposure baking operation, is applied as the liquid or vapor after the selectively exposing the photoresist layer to actinic radiation and before the developing the latent pattern, or is applied as the liquid or vapor after the developing the latent pattern.

9. The method according to claim 8, wherein the base composition further comprises a photobase generator.

10. The method according to claim 8, wherein the base composition is applied to the photoresist layer during a post exposure baking operation or a cooling operation after the post exposure baking operation.

11. The method according to claim 8, wherein the photoresist layer is formed of a metallic resist, a negative resist, or a negative tone developed resist.

12. The method according to claim 8, wherein the base composition further comprises a non-organic base or an organic base.

13. The method according to claim 8, wherein the base composition is applied in a vacuum chamber.

14. A method of manufacturing a semiconductor device, comprising:

forming a photoresist layer over a substrate, wherein the photoresist layer is formed of a metallic resist, a negative resist, or a negative tone developed resist;

applying a base composition to the photoresist layer, selectively exposing the photoresist layer to actinic radiation to form a latent pattern; and developing the latent pattern by applying a developer composition to the selectively exposed photoresist layer to form a pattern in the photoresist layer, wherein the base composition is applied in a gas phase after the photoresist layer is formed and before the developing the latent pattern, or is applied in the gas phase after the developing the latent pattern.

15. The method according to claim 14, wherein the base composition is applied to the photoresist layer during a pre-exposure baking operation or a cooling operation after the pre-exposure baking operation.

16. The method according to claim 14, wherein the base composition is applied to the photoresist layer after the exposing the photoresist layer to actinic radiation.

17. The method according to claim 14, wherein the base composition is applied to the photoresist layer during a post exposure baking operation or a cooling operation after the post exposure baking operation.

18. The method according to claim 14, wherein the base composition is applied in a vacuum chamber.

19. The method according to claim 14, wherein the photoresist layer is formed in a vacuum chamber.

20. The method according to claim 19, wherein the base composition is applied in the vacuum chamber.

* * * * *